US009590657B2

(12) United States Patent
Sedighi et al.

(10) Patent No.: US 9,590,657 B2
(45) Date of Patent: Mar. 7, 2017

(54) LOW POWER LOW-DENSITY PARITY-CHECK DECODING

(71) Applicants: Behnam Sedighi, South Bend, IN (US); Nagaraj Prasanth Anthapadmanabhan, Bridgewater, NJ (US); Dusan Suvakovic, Pleasanton, CA (US)

(72) Inventors: Behnam Sedighi, South Bend, IN (US); Nagaraj Prasanth Anthapadmanabhan, Bridgewater, NJ (US); Dusan Suvakovic, Pleasanton, CA (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 112 days.

(21) Appl. No.: 14/615,717

(22) Filed: Feb. 6, 2015

(65) Prior Publication Data

US 2016/0233884 A1 Aug. 11, 2016

(51) Int. Cl.
*H03M 13/00* (2006.01)
*H03M 13/11* (2006.01)

(52) U.S. Cl.
CPC ...... *H03M 13/112* (2013.01); *H03M 13/1122* (2013.01); *H03M 13/6502* (2013.01); *H03M 13/6572* (2013.01); *H03M 13/6575* (2013.01); *H03M 13/6577* (2013.01)

(58) Field of Classification Search
CPC .......... H03M 13/1117; H03M 13/1137; H03M 13/114; H03M 13/116; G06F 11/1012
See application file for complete search history.

(56) References Cited

U.S. PATENT DOCUMENTS

| 7,395,490 | B2 | 7/2008 | Richardson | |
|---|---|---|---|---|
| 7,962,830 | B2 | 6/2011 | Eroz | |
| 8,140,930 | B1 * | 3/2012 | Maru | H03M 13/1111 |
| | | | | 714/752 |
| 8,291,292 | B1 * | 10/2012 | Varnica | H03M 13/1114 |
| | | | | 714/758 |
| 2005/0210366 | A1 | 9/2005 | Maehata | |

(Continued)

OTHER PUBLICATIONS

Zhang et al., "An Efficient 10GBASE-T Ethernet LDPC Decoder Design With Low Error Floors," IEEE Journal of Solid-State Circuits, vol. 45, Issue 4, Mar. 24, 2010, pp. 843-855.

(Continued)

*Primary Examiner* — Guy Lamarre
(74) *Attorney, Agent, or Firm* — Tong, Rea, Bentley & Kim, LLC

(57) ABSTRACT

In general, a minimum determination capability, adapted for determining one or more minimum values from a set of values, is provided. The minimum determination capability may enable, for a set of values, determination of a first minimum value representing a smallest value of the set of values and a second minimum value representing an approximation of a next-smallest value of the set of values. The minimum determination capability may enable, for a set of values where each of the values is represented as a respective set of bits at a respective set of bit positions, determination of a minimum value of the set of values based on a set of bitwise comparisons performed for the respective bit positions of the values.

20 Claims, 12 Drawing Sheets

(56) References Cited

U.S. PATENT DOCUMENTS

| | | |
|---|---|---|
| 2005/0257106 A1 | 11/2005 | Luby |
| 2006/0026486 A1 | 2/2006 | Richardson |
| 2007/0195894 A1 | 8/2007 | Shokrollahi |
| 2008/0288846 A1* | 11/2008 | Kyung ............... H03M 13/1111 |
| | | 714/752 |
| 2009/0327800 A1* | 12/2009 | Kim .................... G06F 11/1044 |
| | | 714/5.11 |
| 2012/0054576 A1 | 3/2012 | Gross |
| 2014/0281794 A1* | 9/2014 | Sakaue ............... G06F 11/1012 |
| | | 714/758 |
| 2015/0227419 A1* | 8/2015 | Sakaue .................. G11C 29/52 |
| | | 714/764 |

OTHER PUBLICATIONS

Fossorier et al., "Reduced Complexity Iterative Decoding of Low-Density Parity Check Codes Based on Belief Propagation," IEEE Transactions on Communications, vol. 47, Issue 5, May 1999, pp. 673-680.

Chen et al., "Near Optimum Universal Belief Propagation Based Decoding of Low-Density Parity Check Codes," IEEE Transactions on Communications, vol. 50, Issue 3, Mar. 2002, pp. 406-414.

Darabiha et al., "A Bit-Serial Approximate Min-Sum LDPC Decoder and FPGA Implementation," 2006 IEEE International Symposium on Circuits and Systems (ISCAS'06), May 21, 2006, pp. 21-24.

Darabiha et al., "Power Reduction Techniques for LDPC Decoders," IEEE Journal of Solid-State Circuits, vol. 43, Issue 8, Aug. 2008, pp. 1835-1845.

\* cited by examiner

| $\delta_1(bit0)$ | $\delta_2(bit0)$ | $\delta_3(bit0)$ | $\delta_4(bit0)$ | $\delta_5(bit0)$ | $\delta_6(bit0)$ | $\delta_7(bit0)$ | $\delta_8(bit0)$ | $Ind_2$ | $Ind_1$ | $Ind_0$ |
|---|---|---|---|---|---|---|---|---|---|---|
| 0 | X | X | X | X | X | X | X | 0 | 0 | 0 |
| 1 | 0 | X | X | X | X | X | X | 0 | 0 | 1 |
| 1 | 1 | 0 | X | X | X | X | X | 0 | 1 | 0 |
| 1 | 1 | 1 | 0 | X | X | X | X | 0 | 1 | 1 |
| 1 | 1 | 1 | 1 | 0 | X | X | X | 1 | 0 | 0 |
| 1 | 1 | 1 | 1 | 1 | 0 | X | X | 1 | 0 | 1 |
| 1 | 1 | 1 | 1 | 1 | 1 | 0 | X | 1 | 1 | 0 |
| 1 | 1 | 1 | 1 | 1 | 1 | 1 | 0 | 1 | 1 | 1 |

TRUTH TABLE 800

FIG. 8

LOW POWER LOW-DENSITY PARITY-CHECK DECODING

TECHNICAL FIELD

The disclosure relates generally to minimum value determination capabilities and, more specifically but not exclusively, to implementation of minimum value determination capabilities for a check node unit (CNU) of a low-density parity-check (LDPC) decoder.

BACKGROUND

In information theory, a low-density parity-check (LDPC) code is a linear error correcting code for use in transmission of a message over a, typically noisy, transmission channel. For example, LDPC codes are a powerful technique for forward error-correction (FEC). LDPC codes are finding increasing use in applications requiring reliable and highly-efficient information transfer over bandwidth or return channel-constrained links in the presence of corrupting noise. For example, at least partially due to the parallel structure of the LDPC decoders, LDPC decoders are well-suited for multi-gigabit communications. Disadvantageously, however, soft-decision LDPC decoders are typically relatively large, complex, and power-hungry circuits. For example, a 48 Gb/s LDPC decoder might consume 2.8 Watts and occupy more than 5 mm$^2$ of chip area in 65 nm complementary metal-oxide-semiconductor (CMOS) technology. Accordingly, there is a need for LDPC decoders that support reliable and highly-efficient information transfer while consuming less power and occupying less chip area. Furthermore, and more generally, there is a need for improved minimum determination capabilities for use within various contexts.

SUMMARY OF EMBODIMENTS

Various deficiencies in the prior art are addressed by embodiments for minimum value determination.

In at least some embodiments, an apparatus includes a set of modules configured to receive a set of values, evaluate a first portion of the values to determine a magnitude of a minimum value of the first portion of the values, evaluate a second portion of the values to determine a magnitude of a minimum value of the second portion of the values, and determine, based on a comparison of the magnitude of the minimum value of the first portion of the values and the magnitude of the minimum value of the second portion of the values, a first minimum value representing a magnitude of a smallest value of the set of values and a second minimum value representing an approximation of a magnitude of a next-smallest value of the set of values.

In at least some embodiments, a method includes using a set of modules for receiving a set of values, evaluating a first portion of the values to determine a magnitude of a minimum value of the first portion of the values, evaluating a second portion of the values to determine a magnitude of a minimum value of the second portion of the values, and determining, based on a comparison of the magnitude of the minimum value of the first portion of the values and the magnitude of the minimum value of the second portion of the values, a first minimum value representing a magnitude of a smallest value of the set of values and a second minimum value representing an approximation of a magnitude of a next-smallest value of the set of values.

In at least some embodiments, an apparatus includes a set of modules configured to receive a set of values from a set of variable node units (VNUs), evaluate a first portion of the values to determine a magnitude of a minimum value of the first portion of the values, evaluate a second portion of the values to determine a magnitude of a minimum value of the second portion of the values, and compute a set of responses for the set of VNUs based on a comparison of the magnitude of the minimum value of the first portion of the values and the magnitude of the minimum value of the second portion of the values.

In at least some embodiments, a method includes using a set of modules for receiving a set of values from a set of variable node units (VNUs), evaluating a first portion of the values to determine a magnitude of a minimum value of the first portion of the values, evaluating a second portion of the values to determine a magnitude of a minimum value of the second portion of the values, and computing a set of responses for the set of VNUs based on a comparison of the magnitude of the minimum value of the first portion of the values and the magnitude of the minimum value of the second portion of the values.

In at least some embodiments, an apparatus includes a module configured to receive a set of values where each of the values includes a respective set of bits associated with a set of bit positions, and determine, based on a set of bitwise comparisons performed for the respective bit positions, at least one characteristic of a minimum value of the set of values.

In at least some embodiments, a method includes receiving, at a module, a set of values where each of the values includes a respective set of bits associated with a set of bit positions, and determining, at the module based on a set of bitwise comparisons performed for the respective bit positions, at least one characteristic of a minimum value of the set of values.

In at least some embodiments, an apparatus includes a module configured to receive a set of values wherein each of the values includes a respective set of bits associated with a set of bit positions, and determine, based on a set of bitwise comparisons performed for the respective bit positions of the values based on the bits of the values associated with the respective bit positions, at least one of a magnitude of a minimum value of the set of values or an identification of one of the values of the set of values having the magnitude of the minimum value of the set of values.

In at least some embodiments, a method includes receiving, at a module, a set of values wherein each of the values includes a respective set of bits associated with a set of bit positions, and determining, at the module based on a set of bitwise comparisons performed for the respective bit positions of the values based on the bits of the values associated with the respective bit positions, at least one of a magnitude of a minimum value of the set of values or an identification of one of the values of the set of values having the magnitude of the minimum value of the set of values.

In at least some embodiments, an apparatus is configured to evaluate a set of values organized based on a set of bit positions wherein each of the values includes a respective set of bits associated with the respective bit positions. The apparatus includes a set of modules associated with the respective bit positions, the set of modules configured to determine, based on a set of bitwise comparisons performed for the respective bit positions based on the bits of the values associated with the respective bit positions, a magnitude of a minimum value of the set of values. For each of the modules associated with the respective bit positions, the respective module includes a respective bit detector module configured to receive a respective set of input bits for the respective bit position and configured to generate a respective output bit indicative as to whether at least one of the input bits for the respective bit position is a first bit value. For each of a subset of the modules associated with the respective bit positions, the respective module includes a respective mask generation module configured to generate, based on the respective set of bits associated with the respective bit position and based on the respective output bit generated by the respective bit detector module for the respective bit position, a respective disable signal comprising a respective set of disable bits associated with the respective values of the set of values, wherein, based on the respective output bit generated by the respective bit detector module for the respective bit position being indicative that at least one of the input bits for the respective bit position is the first bit value, each of the disable bits associated with a respective one of the values for which the bit in the respective bit position of the value is a second bit value and the bit in a next bit position of the value is the first bit value is configured to change the bit in the next bit position of the value from the first bit value to the second bit value for processing by the bit detector module associated with the next bit position.

In at least some embodiments, an apparatus is configured to evaluate a set of values organized based on a set of bit positions wherein each of the values includes a respective set of bits associated with the respective bit positions. The apparatus includes a first bit detector module associated with a first bit position of the set of bit positions, the first bit detector module configured to receive a respective set of input bits associated with the respective values and generate, for the first bit position, a respective output bit indicative as to whether at least one of the input bits is a first bit value. The apparatus includes a mask generation module configured to generate a disable signal based on the set of bits associated with the first bit position and based on the respective output bit generated for the first bit position, the disable signal comprising a set of disable bits associated with the respective values of the set of values, wherein, based on the respective output bit generated for the first bit position being indicative that at least one of the input bits of the first bit position is the first bit value, each of the disable bits associated with a respective one of the values for which the bit in the first bit position of the value is a second bit value and the bit in a second bit position of the value is the first bit value is configured to change the bit in the second bit position of the value from the first bit value to the second bit value for processing by a second bit detector module associated with the second bit position.

In at least some embodiments, an apparatus is configured to evaluate a set of values. The apparatus includes a module. The module is configured to receive a set of values organized based on a set of bit positions, where each of the values includes a respective set of bits associated with the respective bit positions. The module is configured to determine at least one characteristic of a minimum value of the set of values. The module is configured to determine the at least one characteristic of the minimum value of the set of values based on a set of bitwise comparisons performed for the respective bit positions based on the bits of the values associated with the respective bit positions. The module is configured to determine the at least one characteristic of the minimum value of the set of values based on generation of disable signals configured to prevent select bits of the bit positions from being evaluated during select ones of the bitwise comparisons based on determinations that the select bits are associated with respective ones of the values already disqualified from being the minimum value of the set of values.

BRIEF DESCRIPTION OF THE DRAWINGS

The teachings herein can be readily understood by considering the detailed description in conjunction with the accompanying drawings, in which:

FIG. 8 depicts an exemplary truth table for an index determination module of the processing module of FIG. 5;

To facilitate understanding, identical reference numerals have been used, where possible, to designate identical elements common to the figures.

DETAILED DESCRIPTION OF EMBODIMENTS

In general, a minimum determination capability, adapted for determining one or more minimum values from a set of values, is provided. In at least some embodiments, the minimum determination capability enables, for a set of values, determination of (1) at least one of a magnitude or an identification of a first minimum value representing a smallest value of the set of values and (2) at least one of a magnitude or an identification of a second minimum value representing an approximation of a next-smallest value of the set of values. While such embodiments may be used within various contexts, such embodiments may be well-suited for use by check node unit (CNUs) of a low-density parity-check (LDPC) decoder, where the CNUs are configured to determine a magnitude (typically denoted as $Min_1$) and an identification (typically denoted as $Ind_1$) of a first minimum value representing a smallest value of the set of values and to approximate a magnitude (typically denoted as $Min_2$) of a second minimum value representing an approximation of a next-smallest value of the set of values, in order to provide an LDPC decoder having a bit error rate (BER) performance comparable to that of conventional LDPC decoders while also reducing the complexity, power consumption, and chip area of the LDPC decoder. In at least some embodiments, the minimum determination capability enables, for a set of values where each of the values is represented as a respective set of bits at a respective set of bit positions, determination of at least one characteristic of a minimum value of the set of values (e.g., at least one of a magnitude of the minimum value of the set of values or an identification of one of the values of the set of values having the magnitude of the minimum value of the set of values) based on a set of bitwise comparisons performed for the respective bit positions of the values. These and various other embodiments of the minimum determination capability may be better understood by way of reference to an exemplary system including an LDPC decoder, as depicted in FIG. 1.

Figure 1:
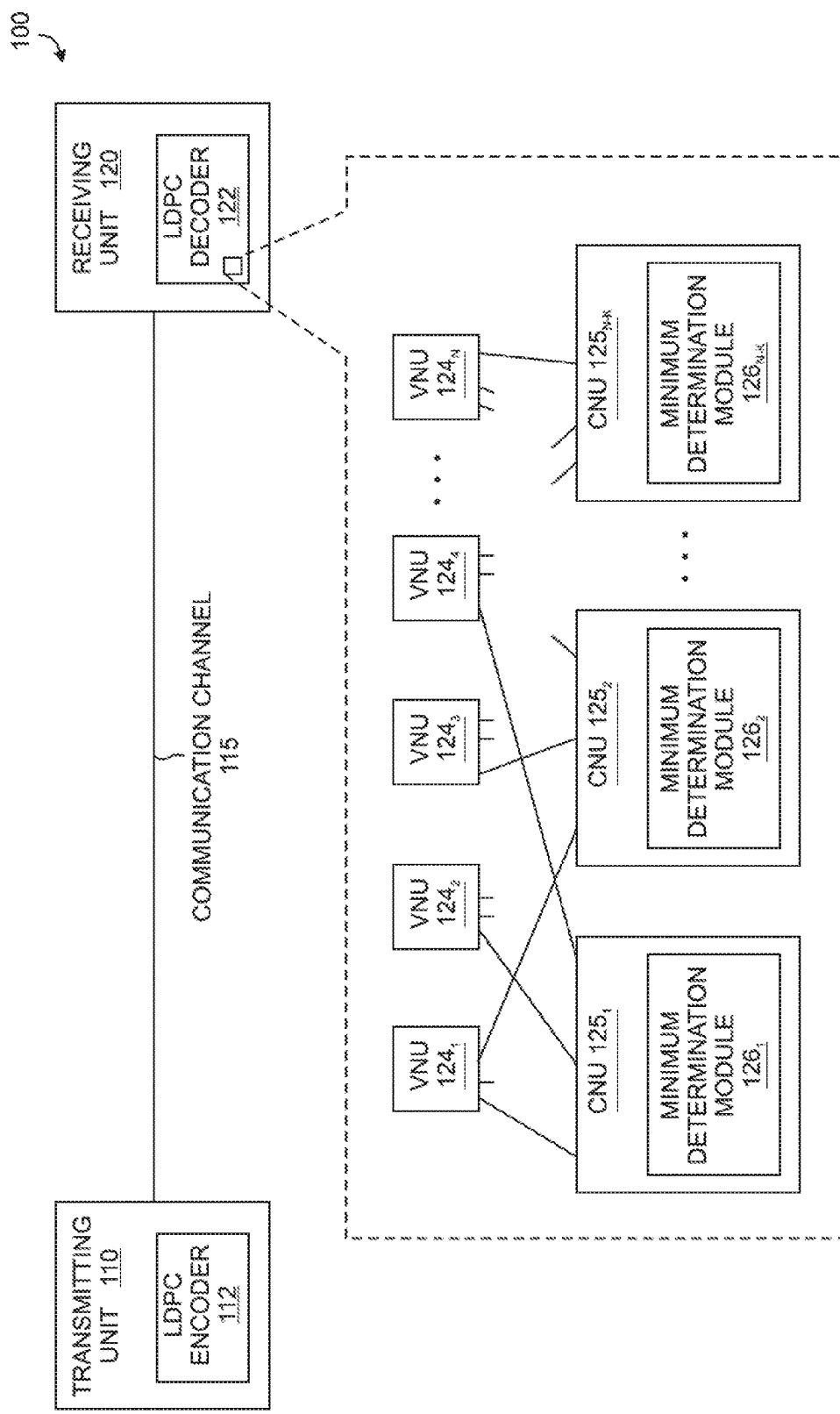
FIG. 1 depicts an exemplary communication system including an LDPC encoder and an LDPC decoder supporting use of LDPC codes.

FIG. 1 depicts an exemplary communication system including an LDPC encoder and an LDPC decoder supporting use of LDPC codes.

As depicted in FIG. 1, exemplary communication system 100 includes a transmitting unit 110 and a receiving unit 120 communicatively connected via a communication channel 115. The communication system 100 may be any type of communication system in which LDPC codes may be used, such as a wireless communication system, optical communication system, or the like. The transmitting unit 110 includes an LDPC encoder 112 and, similarly, the receiving unit 120 includes an LDPC decoder 122. The LDPC encoder 112 and LDPC decoder 122 cooperate to provide forward error correction (FEC) for data transmitted from the transmitting unit 110 to the receiving unit 120 via the communication channel 115. The LDPC encoder 112 is configured to generate an LDPC codeword, which is transmitted to receiving unit 120 via communication channel 115. The generation of the LDPC codeword by LDPC encoder 112 will be understood by one skilled in the art and, thus, is not discussed further herein. For example, generation of the LDPC codeword by LDPC encoder 112 may be performed as described in the paper entitled "Low-Density Parity-Check Codes" by Robert Gallager (which is hereby incorporated by reference herein) or using any other suitable mechanism for LDPC codeword generation. The LDPC decoder 122 is configured to receive the LDPC codeword and to decode the LDPC codeword as discussed in additional detail below.

As further depicted in FIG. 1, LDPC decoder 122 includes a set of N variable node units (VNUs) $124_1$-$124_N$ (collectively, VNUs 124) and a set of N-K check node units (CNUs) $125_1$-$125_{N-K}$ (collectively, CNUs 125), where each VNU 124 is communicatively connected to multiple CNUs 125 and, similarly, each CNU 125 is communicatively connected to multiple VNUs 124. The LDPC decoder 122, being arranged in this manner, is configured to perform decoding for LDPC(N,K) codes. The VNUs 124 and CNUs 125 cooperate to perform iterative decoding of LDPC codewords received at LDPC decoder 122. More specifically, VNUs 124 and CNUs 125 exchange messages in an iterative manner to perform decoding of LDPC codewords received at LDPC decoder 122.

The operation of LDPC decoder 122 in decoding LDPC codewords received at LDPC decoder 122 may be better understood by first considering a commonly used LDPC decoding algorithm known as the normalized min-sum algorithm (MSA). In MSA, if a CNU is connected to M VNUs and, thus, receives M input messages (denoted as $\beta_i$, i=1, ..., M), the CNU then computes M output messages (denoted as $\alpha_i$, i=1, ..., M); i.e., one for each of the connected VNUs. In MSA, the output message $\alpha_i$ to VNU i involves the computation of the minimum of incoming messages from all the remaining VNUs j=1, ..., M where j≠i. More specifically, for i=1 to M, $$\alpha_i = S_{norm}\min(|\beta_1|, |\beta_2|, \ldots, |\beta_{i-1}|, |\beta_{i+1}|, \ldots, |\beta_M|) \prod_{j=1 \text{ to } M(j \neq i)} \text{sign}(\beta_j),$$

where $\beta_i$ and $\alpha_i$ are the $i^{th}$ input and output messages of the CNU, the sign function sign(.) returns the arithmetic sign (i.e., outputs +1 or −1 depending on the sign), the absolute-value function |.| returns the arithmetic magnitude, the minimum function min(.) returns the minimum value of the arguments, and $S_{norm}$ is a normalization factor. The input and output messages have a word-length of w, including the sign bit (i.e., the magnitude portion of the messages is w-1 bits). It will be appreciated that, typically, the complexity of the CNU is primarily in evaluating the minimum function. In order to evaluate this minimum for each of the output messages, the computation essentially reduces to computing the first and second minimums among all input messages, as explained next. If the first and second minimums, amongst all $|\beta_i|$s, are indicated by $\text{Min}_1=|\beta_{Ind1}|$ and $\text{Min}_2$, where $\text{Ind}_1$ is the index of the first minimum, then the output of the min(.) function in the equation above is $\text{Min}_2$ for i=$\text{ind}_1$, and $\text{Min}_1$ otherwise. If more than one input has a magnitude equal to $\text{Min}_1$ (i.e., multiple inputs have the same smallest value), then $\text{Min}_2$ is equal to $\text{Min}_1$ and $\text{Ind}_1$ essentially plays no role.

In at least some embodiments, the LDPC decoder 122 is configured to use a justified approximation of the minimum computation of MSA which still achieves good BER performance compared to use of MSA. More specifically, each CNU 125 of the LDPC decoder 122 may be configured to use a justified approximation of the minimum computation of MSA. The use of the justified approximation of the minimum computation of MSA by a CNU 125 obviates the need for the CNU 125 to be configured to compute the second minimum at each stage of the CNU 125. Thus, use of the justified approximation of the minimum computation of MSA provides BER performance comparable to that of conventional LDPC decoders while reducing the complexity, power consumption, and chip area of such conventional LDPC decoders.

In at least some embodiments, a CNU $125_i$ of LDPC decoder 122 may be configured to determine the magnitude of the first minimum value ($\text{Min}_1$) and to approximate the magnitude of the second minimum value ($\text{Min}_2$). The CNU $125_i$ is configured to receive M input messages from M VNUs 124 to which the $\text{CNU}_i$ 125 is connected, where the M messages convey M|$\beta_i$| values from the M VNUs 124 to which the $\text{CNU}_i$ 125 is connected. The CNU $125_i$ is configured to evaluate or process a first portion of the M messages to determine a magnitude of a minimum value from among the |$\beta_i$| values of the messages of the first portion of the M messages, evaluate or process a second portion of the M messages to determine a magnitude of a minimum value from among the |$\beta_i$| values of the messages of the second portion of the M messages, and compare the magnitude of the minimum value from among the |$\beta_i$| values of the messages of the first portion of the M messages and the magnitude of the minimum value from among the |$\beta_i$| values of the messages of the second portion of the M messages to determine the magnitude of the first minimum value ($\text{Min}_1$) and an approximation of the magnitude of the second minimum value ($\text{Min}_2$). In at least some embodiments, the first and second portions of the M messages may include equal numbers of messages (namely, M/2 messages per portion). In at least some embodiments, the first portion of M messages may include the first M/2 messages (including the $|\beta_1|-|\beta_{M/2}|$ values) and the second portion of M messages may include the second M/2 messages (including the $|\beta_{(M/2)+1}|-|\beta_M|$ values), although it will be appreciated that the M messages (and, thus, the $|\beta_i|$ values of the M messages) may be evaluated or processed in various other combinations in order to determine the magnitude of the first minimum value ($Min_1$) and to approximate the magnitude of the second minimum value ($Min_2$). In at least some embodiments, the first and second portions of the M messages may include arbitrarily selected portions of the M messages. The magnitude of the first minimum value ($Min_1$) is the lesser of the minimum $|\beta_i|$ value from among the $|\beta_i|$ values of the messages of the first portion of the M messages and the minimum $|\beta_i|$ value from among the $|\beta_i|$ values of the messages of the second portion of the M messages. The magnitude of the second minimum value ($Min_2$) is the greater of the minimum $|\beta_i|$ value from among the $|\beta_i|$ value of the messages of the first portion of the M messages and the minimum $|\beta_i|$ value from among the $|\beta_i|$ value of the messages of the second portion of the M messages. The CNU $125_i$ also may be configured to determine the index of the first minimum value ($Min_1$), which provides an indication of the location of the first minimum value ($Min_1$) within the $|\beta_i|$ values of the M messages (i.e., identification of which of the $|\beta_i|$ values of the M messages has the magnitude given by the first minimum value ($Min_1$)). The CNU $125_i$ also may be configured to determine the index of the second minimum value ($Min_2$), which provides an indication of the location of the second minimum value ($Min_2$) within the $|\beta_i|$ values of the M messages (i.e., identification of which of the $|\beta_i|$ values of the M messages has the magnitude given by the second minimum value ($Min_2$)).

Accordingly, it will be appreciated that the first minimum value ($Min_2$) that is output will be the magnitude of the smallest value of all of the $|\beta_i|$ values of the M messages received by CNU $125_i$, and that the second minimum value ($Min_2$) that is output may or may not be the magnitude of the true next smallest value of all of the $|\beta_i|$ values of the M messages received by CNU $125_i$ (and, thus, is described herein as providing an approximation of the magnitude of the second minimum value ($Min_2$)). For example, if the smallest $|\beta_i|$ value of the M messages is in the first portion of messages evaluated or processed and the next smallest $|\beta_i|$ value of the M messages is in the second portion of messages evaluated or processed, then the first minimum value ($Min_1$) will be the magnitude of the smallest value of all of the $|\beta_i|$ values of the M messages received by CNU $125_i$ and second minimum value ($Min_2$) will be magnitude of the true next smallest value of all of the $|\beta_i|$ values of the M messages received by CNU $125_i$. By contrast, for example, if the smallest $|\beta_i|$ value of the M messages and the next smallest $|\beta_i|$ value of the M messages are in the same portion of messages evaluated or processed, then the first minimum value ($Min_1$) will be the magnitude of the smallest value of all of the $|\beta_i|$ values of the M messages received by CNU $125_i$ but the second minimum value ($Min_2$) will not be the magnitude of the true next smallest value of all of the $|\beta_i|$ values of the M messages received by CNU $125_i$ (and, thus, the second minimum value ($Min_2$) is overestimating the magnitude of the true next smallest value of all of the $|\beta_i|$ values of the M messages). In other words, the first minimum value ($Min_1$) will always be computed correctly, and the second minimum value ($Min_2$) may or may not be computed correctly (and, thus, again, is considered to be an approximation of the second minimum value ($Min_2$)). However, since M-1 outputs of a CNU depend only on the first minimum value ($Min_1$), only one output of the CNU might suffer from error. Thus, given only a potential for a minimal increase in error resulting from approximating the second minimum value ($Min_2$), it is possible to achieve BER performance comparable to that of conventional LDPC decoders while reducing chip area, complexity, and power consumption of conventional LDPC decoders.

It will be appreciated that, although primarily depicted and described with respect to operation of the CNU $125_i$ of LDPC decoder 122 in computing the magnitudes of the minimum values, the CNU $125_i$ of LDPC decoder 122 may be configured to perform various other functions (e.g., sign calculation and the like, as will be understood by one skilled in the art) which have been omitted herein for purposes of clarity.

It will be appreciated that, following calculation of first minimum value ($Min_1$) and the second minimum value ($Min_2$) as discussed above, decoding may proceed in the normal manner, a description of which has been omitted herein for purposes of clarity.

Figure 2:
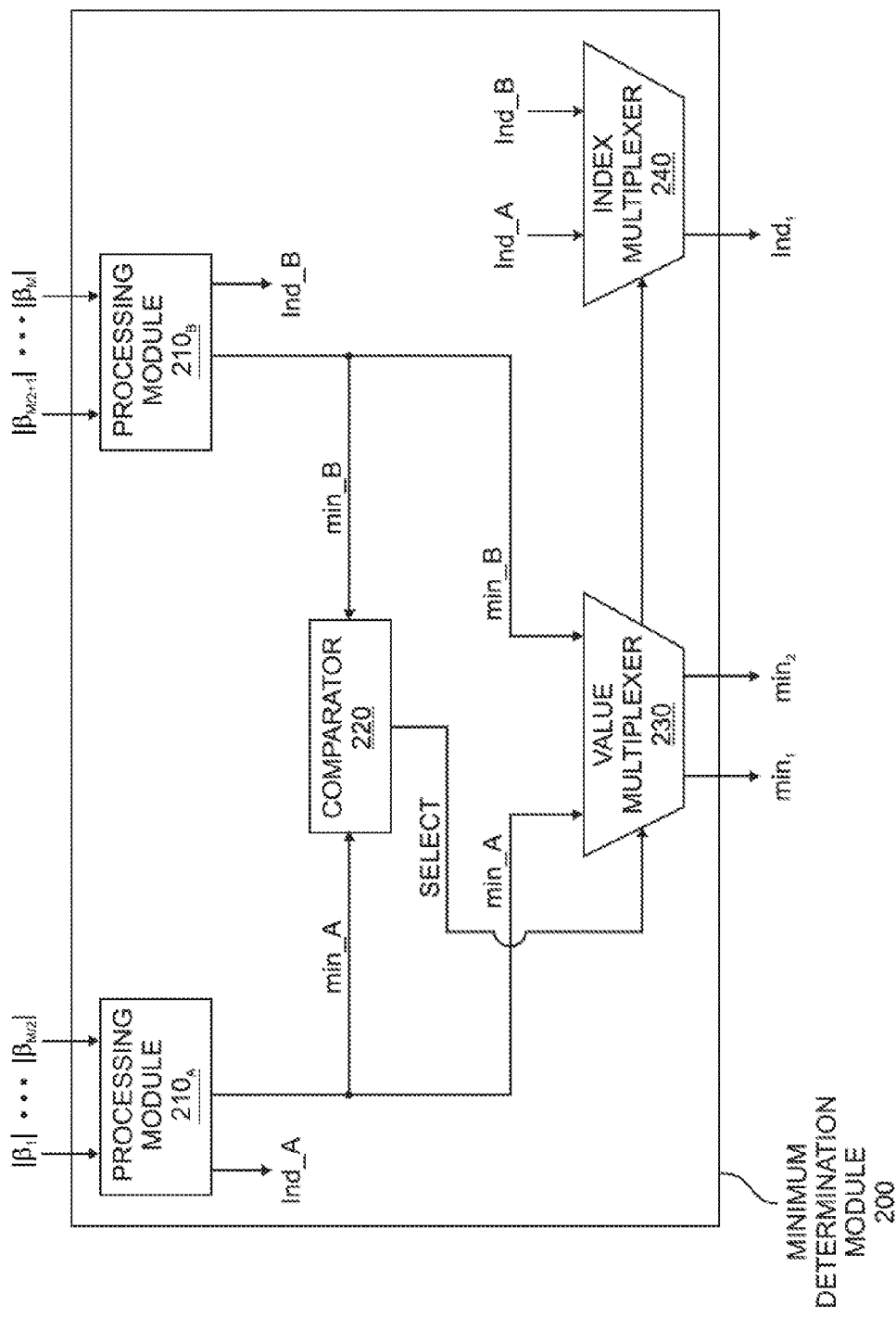
FIG. 2 depicts an exemplary minimum determination module of a CNU of the LDPC decoder of FIG. 1.

An exemplary embodiment of a minimum determination module $126_i$ of a CNU $125_i$ of LDPC decoder 122 is depicted and described with respect to FIG. 2.

FIG. 2 depicts an exemplary minimum determination module of a CNU of the LDPC decoder of FIG. 1. The minimum determination module 200 includes a first processing module $210_A$ and a second processing module $210_B$ (collectively, processing modules 210), a comparator 220, a value multiplexer 230, and an index multiplexer 240.

The processing modules 210 each are configured to receive a set of M/2 $|\beta_i|$ values (from among the set of M $|\beta_i|$ values received in the M messages from the M VNUs to which the CNU is connected) and to determine a magnitude of a minimum $|\beta_i|$ value from among the set of M/2 $|\beta_i|$ values and an associated index associated with the minimum $|\beta_i|$ value from among the set of M/2 $|\beta_i|$ values, respectively. More specifically, processing modules 210 are configured such that (1) first processing module $210_A$ is configured to receive a first half of the M $|\beta_i|$ values (e.g., including the $|\beta_1|-|\beta_{M/2}|$ values) and to determine a magnitude of a minimum $|\beta_i|$ value from among the set of M/2 $|\beta_i|$ values (denoted as min_A) and an associated index associated with the minimum $|\beta_i|$ value from among the set of M/2 $|\beta_i|$ values (denoted as Ind_A) which indicates which of the M/2 $|\beta_i|$ values has the magnitude of the minimum $|\beta_i|$ value from among the set of M/2 $|\beta_i|$ values and (2) second processing module $210_B$ is configured to receive a second half of the M $|\beta_i|$ values (e.g., including the $|\beta_{(M/2)+1}|-|\beta_M|$ values) and to determine a minimum $|\beta_i|$ values from among the set of M/2 $|\beta_i|$ values (denoted as min_B) and an associated index associated with the minimum $|\beta_i|$ value from among the set of M/2 $|\beta_i|$ values (denoted as Ind_B) which indicates which of the M/2 $|\beta_i|$ values has the magnitude of the minimum $|\beta_i|$ value from among the set of M/2 $|\beta_i|$ values. The minimum value outputs of the processing modules 210 (min_A, min_B) are provided as inputs to comparator 220 and as inputs to value multiplexer 230. The index outputs of the processing modules 210 (Ind_A, Ind_B) are provided as inputs to index multiplexer 240.

The comparator 220 is configured to compare the minimum value outputs of the processing modules 210 (min_A, min_B) to determine which of the minimum values is smaller, and to generate a select signal for the value multiplexer 230 on the basis of which of the minimum values (min_A, min_B) is smaller. The value multiplexer 230 is configured to receive the minimum value outputs of the processing modules 210 (min_A, min_B) and, under control of the select signal from comparator 220, to output the minimum value outputs of the processing modules 210 in a manner for indicating which of the minimum value outputs of the processing modules 210 is output as the first minimum value ($Min_1$) of the set of M $|\beta_i|$ values and which of the minimum value outputs of the processing modules 210 is output as the second minimum value ($Min_2$) of the set of M $|\beta_i|$ values. The value multiplexer 230 is configured to pass the select signal from the comparator 220 through to index multiplexer 240 for controlling outputting of the first index ($Ind_1$) of the first minimum value ($Min_1$) in accordance with outputting of the minimum value outputs of the value multiplexer 230. The index multiplexer 240 is configured to receive the indexes of the processing modules 210 (Ind_A, Ind_B), and to output the indexes of the processing modules 210 in a manner for associating the first index ($Ind_1$) of the first minimum value ($Min_1$) with the first minimum value ($Min_1$) output from value multiplexer 230.

In this manner, the smallest of the minimum value outputs of the processing modules 210 may be output as the first minimum value ($Min_1$) of the set of M $|\beta_i|$ values and the next smallest of the minimum value outputs of the processing modules 210 may be output as the second minimum value ($Min_2$) of the set of M $\beta_i$ values and, further, the first index ($Ind_1$) of the first minimum value ($Min_1$) may be associated with the first minimum value ($Min_1$) to indicate the location of the first minimum value ($Min_1$) within the set of M $\beta_i$ values (and, optionally, the second index ($Ind_2$) of the second minimum value ($Min_2$) may be associated with the second minimum value ($Min_2$) to indicate the location of the second minimum value ($Min_2$) within the set of M $\beta_i$ values).

It will be appreciated that, although primarily depicted and described with respect to embodiments in which processing modules 210 are configured such that (1) first processing module $210_A$ is configured to receive and process a first half of the M $|\beta_i|$ values (e.g., including the specific $|\beta_1|-|\beta_{M/2}|$ values) and (2) second processing module $210_B$ is configured to receive and process a second half of the M $|\beta_i|$ values (e.g., including the specific $\beta(M_2)_{+1}|-|\beta_M|$ values), the processing modules 210 may be configured such that the processing modules 210 receive respective halves of the M $|\beta_i|$ values but the specific $|\beta_i|$ values that are provided to the processing modules 210 are arranged differently (e.g., first processing module $210_A$ is configured to receive and process the $|\beta_1|-|\beta_{M/4}|$ values and the $|\beta_{(3M/4)+1}|-|\beta_M|$ values and second processing module $210_B$ is configured to receive and process the $|\beta_{(M/4)+1}|-|\beta_{3M/4}|$ values), the processing modules 210 may be configured such that one of the processing modules 210 receives different sized portions of the $|\beta_i|$ values (e.g., first processing module $201_A$ receives and processes greater than M/2 $|\beta_i|$ values and second processing module $201_B$ receives and processes less than M/2 $|\beta_i|$ values), or the like, as well as various combinations thereof. Accordingly, it will be appreciated that, although primarily depicted and described with respect to a specific arrangement of functions using specific numbers, types, and arrangements of modules, functions of minimum determination module 200 of FIG. 2 may be implemented in various other ways (e.g., using other numbers, types, and arrangements of modules configured to process respective portions of the set of M $|\beta_i|$ values to determine the magnitude and location of the first minimum value ($Min_1$) and to approximate the magnitude and location of the second minimum value ($Min_2$)). A first exemplary embodiment of a minimum determination module $126_i$ of a CNU $125_i$ of LDPC decoder 122 (or of minimum determination module 200 of FIG. 2) is depicted and described with respect to FIG. 3 and FIG. 4. A second exemplary embodiment of a minimum determination module $126_i$ of a CNU $125_i$ of LDPC decoder 122 (or of minimum determination module 200 of FIG. 2) is depicted and described with respect to FIGS. 5-8.

Referring again to FIGS. 1 and 2, it will be appreciated that, in at least some embodiments, processing modules 210 of FIG. 2 may be implemented as a hierarchical tree structure(s) of 2-input elements configured to receive, from M VNUs to which the CNU is connected, M messages including M $|\beta_i|$ values and to perform successive comparisons of the M $|\beta_i|$ values until two of the M $|\beta_i|$ values remain and, thus, are selected as the first minimum value ($Min_1$) and the second minimum value ($Min_2$)). An exemplary embodiment is depicted and described with respect to FIG. 3.

Figure 3:
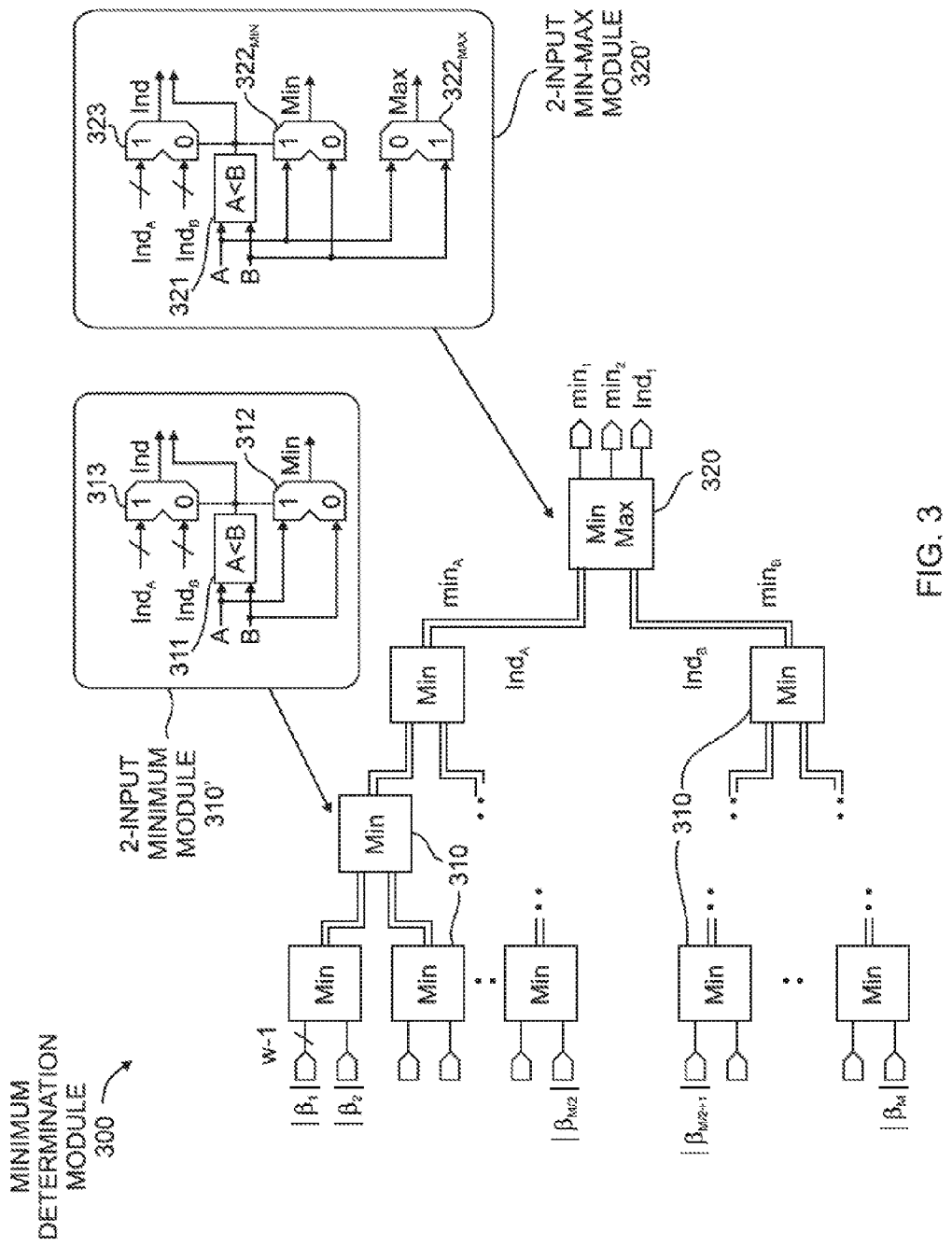
FIG. 3 depicts an exemplary minimum determination module of a CNU of the LDPC decoder of FIG. 1.

FIG. 3 depicts an exemplary minimum determination module of a CNU of the LDPC decoder of FIG. 1.

As depicted in FIG. 3, the minimum determination module 300 includes a tree structure of 2-input elements. The tree structure of 2-input elements is configured to receive, from M VNUs to which the CNU is connected, M messages including M $|\beta_i|$ values. The tree structure of 2-input elements is configured to output a first minimum value ($Min_1$) which is the magnitude of the smallest of the M $|\beta_i|$ values received by the minimum determination module 300 and a second minimum value ($Min_2$) which is an approximation of the magnitude of the next smallest of the M $|\beta_i|$ values received by the minimum determination module 300. As indicated in FIG. 3, the $\beta_i$ values are assumed to be w bits in length where w-1 bits provide the magnitude of the value and one bit indicates the sign of the value, and it is assumed that only the magnitude portions $|\beta_i|$ of the $\beta_i$ values are evaluated for determining the first minimum value ($Min_1$) and the second minimum value ($Min_2$). Additionally, it is noted that references to the elements being "2-input" elements is based on the number of $|\beta_i|$ values compared by the 2-input elements, and does not account for tracking of the index ($Ind_1$) for the first minimum value ($Min_1$). The tree structure of 2-input elements includes X stages of 2-input elements, where X=ceiling(log 2(M)). It will be appreciated that, given M $|\beta_i|$ values to be compared, the tree structure may include M/2 2-input minimum modules 310 in the first stage, M/4 2-input minimum modules 310 in the second stage (assuming M≥5), and so forth, with a single 2-input min-max module 320 at the Xth stage of the tree structure.

The minimum determination module 300 includes X-1 stages of 2-input minimum modules 310. The 2-input minimum modules 310 each include two value inputs for receiving two values to be compared and one value output for outputting the minimum value of the two compared values. In the case of the first stage of the tree structure, the two value inputs of the 2-input minimum module 310 receive 2 $|\beta_i|$ values received by minimum determination module 300 from the VNUs to which the CNU is connected. In the case of any additional stages of the tree structure other than the first stage of the tree structure (e.g., a k-th stage), the two value inputs of the 2-input minimum module 310 receive two $|\beta_i|$ values output from two 2-input minimum modules 310 at the previous stage (e.g., a (k−1)th stage) of the tree structure. Additionally, in the case of any additional stages of the tree structure other than the first stage of the tree structure, (e.g., a k-th stage), the 2-input minimum module 310 also includes (1) two index inputs for receiving indexes associated with the two values received via the two value inputs and (2) one index output for outputting the one of the two received indexes associated with the minimum value output from the value output. As discussed further below, the index may be propagated in various ways (e.g., the index is log 2(M) bits long in which case we simply output one of the 2 received indexes in each stage, the index grows by 1 bit at each stage (in which case one of the 2 received indexes is output and an extra bit is further appended depending on which input was minimum), or the like). An exemplary 2-input minimum module 310' is depicted in FIG. 3.

The 2-input minimum module 310' is configured for use at a stage other than the first stage of the tree structure. The 2-input minimum module 310' includes a minimum determination element 311, a value multiplexer 312, and an index multiplexer 313. The minimum determination element 311 receives the two values (denoted as A and B) from the previous stage of the tree structure, the value multiplexer 312 also receives the two values (again, denoted as A and B) from the previous stage of the tree structure, and the index multiplexer 313 receives the two indexes (denoted as $Ind_A$ and $Ind_B$, which are associated with values A and B, respectively) from the previous stage of the tree structure. The minimum determination element 311 compares the two values to determine which of the two values is smaller, and outputs a signal indicative as to which of the two values is smaller. The indication as to which of the two values is smaller is used as a control signal for both the value multiplexer 312 and the index multiplexer 313. If a determination is made that value A is less than value B, the signal indicative as to which of the two values is smaller that is output from minimum determination element 311 causes value multiplexer 312 to select the input corresponding to value A and, similarly, causes index multiplexer 313 to select the input corresponding to $Ind_A$. Alternatively, if a determination is made that value B is less than value A, the signal indicative as to which of the two values is smaller that is output from minimum determination element 311 causes value multiplexer 312 to select the input corresponding to value B and, similarly, causes index multiplexer 313 to select the input corresponding $Ind_B$. In this manner, the minimum values and associated indexes for the minimum values may be propagated toward the 2-input min-max module 320 for a final determination of the first minimum value ($Min_1$) which is the smallest of the M $|\beta_i|$ values received by the minimum determination module 300 and the second minimum value ($Min_2$) which is an approximation of the next smallest of the M $|\beta_i|$ values received by the minimum determination module 300. It will be appreciated that a 2-input minimum module 310' for use at the first stage of the tree structure may omit the index multiplexer 313 and, rather, may simply output an index associated with the minimum value for use at the next stage of the tree structure. It will be appreciated that, although depicted and described with respect to a specific embodiment of a 2-input minimum module 310 (illustratively, exemplary 2-input minimum module 310'), the 2-input minimum module 310 may be implemented in various other ways in order to provide functions of the 2-input minimum module 310 as presented herein.

The minimum determination module 300 includes a 2-input min-max module 320 in the $X^{th}$ stage of the tree structure. The 2-input min-max module 320 includes two value inputs for receiving two values from the $(X-1)^{th}$ stage of the tree structure and two value outputs for outputting the two values based on comparison of the two values. The 2-input min-max module 320 is configured to compare the two values received via the two value inputs, and to output the two values from the two value outputs in a manner for indicating (1) the first minimum value ($Min_1$), which is the smaller of the two values received by the 2-input min-max module 320 and provides the magnitude of the smallest value of the M $|\beta_i|$ values received by the minimum determination module 300 and (2) the second minimum value ($Min_2$), which is the larger of the two values received by the 2-input min-max module 320 and provides an approximation of the magnitude of the next-smallest value of the M $|\beta_i|$ values received by the minimum determination module 300. Additionally, the 2-input min-max module 320 also includes (1) two index inputs for receiving indexes associated with the two values received via the two value inputs and (2) one index output for outputting the one of the two received indexes associated with the first minimum value ($Min_1$) determined by 2-input min-max module 320 (which, as discussed herein, is indicative of a location, within the M $|\beta_i|$ values received by the minimum determination module 300, of the $|\beta_i|$ value providing the magnitude of the smallest value of the M $|\beta_i|$ values received by the minimum determination module 300). As discussed further below, the index may be propagated in various ways (e.g., the index is log 2(M) bits long in which case we simply output one of the 2 received indexes in each stage, the index grows by 1 bit at each stage (in which case one of the 2 received indexes is output and an extra bit is further appended depending on which input was minimum), or the like). An exemplary 2-input min-max module 320', which is suitable for use as a 2-input min-max module 320, is depicted in FIG. 3.

The 2-input min-max module 320' includes a minimum determination element 321, a minimum value multiplexer $322_{min}$ and a maximum value multiplexer $322_{max}$, and an index multiplexer 323. The minimum determination element 321 receives the two values (denoted as A and B) from the $(X-1)^{th}$ stage of the tree structure, the minimum value multiplexer $322_{min}$ and the maximum value multiplexer $322_{max}$ each also receive the two values (again, denoted as A and B) from the $(X-1)^{th}$ stage of the tree structure, and the index multiplexer 323 receives the two indexes (denoted as $Ind_A$ and $Ind_B$, which are associated with values A and B, respectively) from the $(X-1)^{th}$ stage of the tree structure. The minimum determination element 321 compares the two values to determine which of the two values is smaller, and outputs a signal (e.g., typically "1" or "0", although any suitable signal may be used) indicative as to which of the two values is smaller. The indication as to which of the two values is smaller is used as a control signal for both the minimum value multiplexer $322_{min}$ and the maximum value multiplexer $322_{max}$, as well as for the index multiplexer 323. If a determination is made that value A is less than value B, the signal indicative as to which of the two values is smaller that is output from minimum determination element 321 causes minimum value multiplexer $322_{min}$ to select the input corresponding to value A and causes the maximum value multiplexer $322_{max}$ to select the input corresponding to value B and, further, causes index multiplexer 323 to select the input corresponding to $Ind_A$. Alternatively, if a determination is made that value B is less than value A, the signal indicative as to which of the two values is smaller that is output from minimum determination element 321 causes minimum value multiplexer $322_{min}$ to select the input corresponding to value B and causes the maximum value multiplexer $322_{max}$ to select the input corresponding to value A and, further, causes index multiplexer 323 to select the input corresponding to $Ind_B$. In this manner, the 2-input min-max module 320 is able to output the first minimum value ($Min_1$) which is the magnitude of the smallest of the M $|\beta_i|$ values received by the minimum determination module 300 and the second minimum value (Min$_2$) which is an approximation of the magnitude of the next smallest of the M |β$_i$| values received by the minimum determination module 300. It will be appreciated that, although depicted and described with respect to a specific embodiment of a 2-input min-max module 320 (illustratively, exemplary 2-input min-max module 320'), the 2-input min-max module 320 may be implemented in various other ways in order to provide functions of the 2-input min-max module 320 as presented herein.

As discussed above, minimum determination module 300, in addition to supporting propagation of |β$_i$| values, also supports propagation of associated index values. In at least some embodiments (as presented in FIG. 3), the propagation of index values may be implemented as follows: (1) in the first stage, there are no index inputs and the index output is a 0 or 1 (essentially the output from the A<B comparator) and (2) in the subsequent stages, the 0 or 1 from the A<B comparator is appended to the appropriate previous (input) index (as shown by the two arrows). In such embodiments, the index is essentially growing by one bit in each stage as each stage adds a "0" or "1" that corresponds to whichever branch of the stage included the minimum value. In at least some embodiments (omitted from FIG. 3, as the embodiments of FIG. 3 are more efficient), the index is a fixed length and does not grow by one bit in each stage; rather, the 2-input blocks are the same in every stage and, essentially, if there are M inputs then log 2(M) bits are used to represent every index and then the index multiplexer essentially multiplexes the entire log 2(M) bit index at every stage. It will be appreciated that, with respect to mapping of FIG. 3 onto FIG. 2, the top half of the tree structure in the first (X-1) stages of the tree structure of FIG. 3 may correspond to first processing module 210$_A$ of FIG. 2, the bottom half of the tree structure in the first (X-1) stages of the tree structure of FIG. 3 may correspond to second processing module 210$_B$ of FIG. 2, and the 2-input min-max module 320 of FIG. 3 may correspond to remaining portions of minimum determination module 200 of FIG. 2.

It will be appreciated that, although primarily depicted and described with respect to embodiments of the minimum determination module 200 in which only a single 2-input min-max module 320 is used in the tree structure and the remaining 2-input elements of the tree structure are 2-input minimum modules 310, in at least some embodiments the minimum determination module may be configured to use 2-input min-max modules at one or more earlier stages of the tree structure, in which case the stage(s) of the tree structure preceding the 2-input min-max modules may include 2-input minimum modules 310 (i.e., such that less 2-input minimum modules 310 would be used) and the stage(s) of the tree structure following the 2-input min-max modules may include 4-input min1-min2 modules (discussed further below). An exemplary embodiment of the minimum determination module 200 in which multiple 2-input min-max modules are used in the tree structure is depicted and described with respect to FIG. 4.

Figure 4:
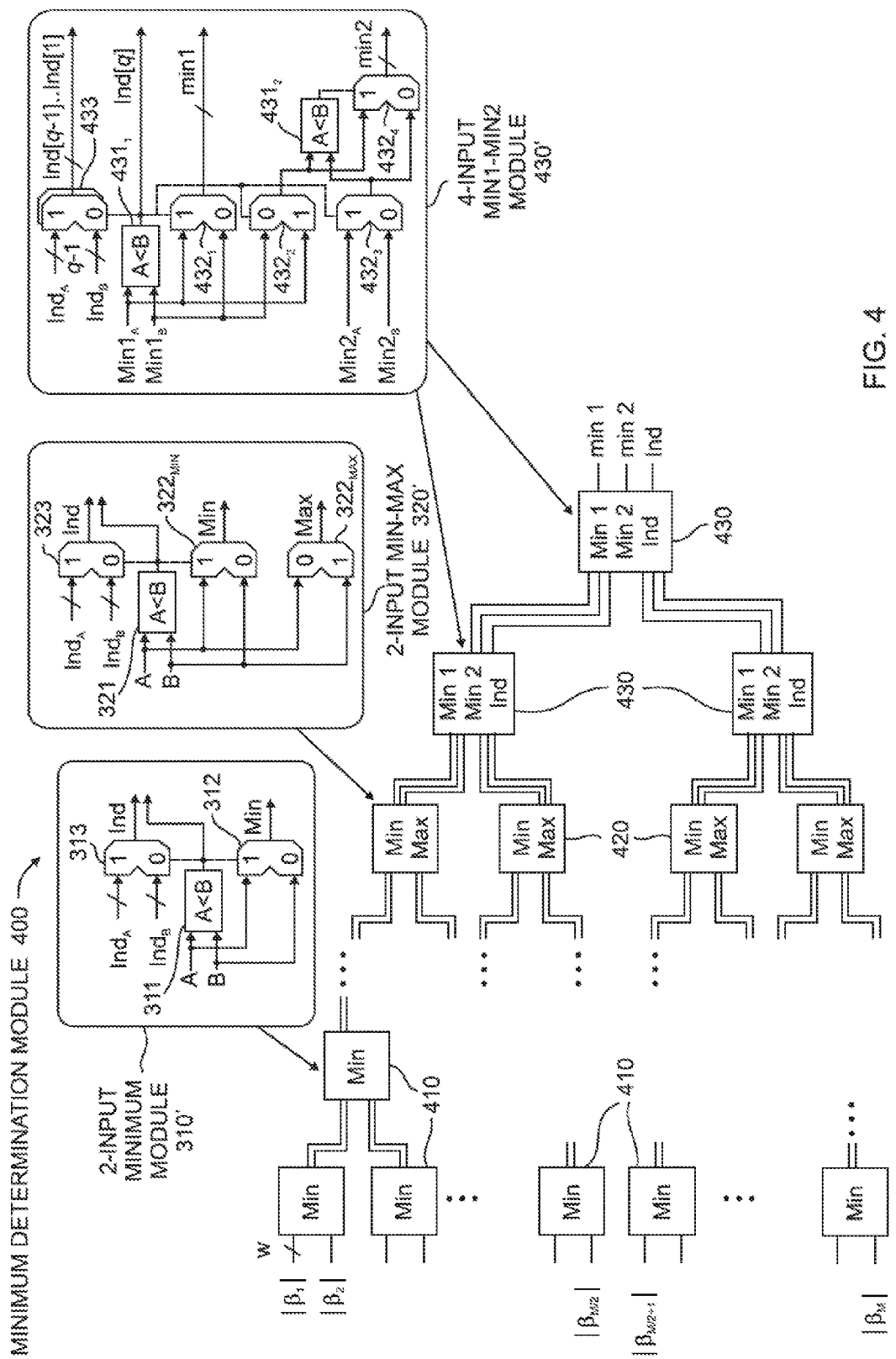
FIG. 4 depicts an exemplary minimum determination module of a CNU of the LDPC decoder of FIG. 1.

FIG. 4 depicts an exemplary minimum determination module of a CNU of the LDPC decoder of FIG. 1. It is noted that portions of the minimum determination module 400 of FIG. 4 are identical to portions of the minimum determination module 300 of FIG. 3.

The minimum determination module 400 includes X-3 stages of 2-input minimum modules 410 (in the first (X-3) stages). The 2-input minimum modules 410 of FIG. 4 are identical to the 2-input minimum modules 310 of FIG. 3 (and, thus, as illustrated in FIG. 4, may be implemented using 2-input minimum module 310' of FIG. 3).

The minimum determination module 400 includes one stage of 2-input min-max modules 410 (in the (X-2)$^{th}$ stage). The 2-input min-max modules 420 of FIG. 4 are identical to the 2-input min-max modules 320 of FIG. 3 (and, thus, as illustrated in FIG. 4, may be implemented using 2-input min-max module 320' of FIG. 3).

The minimum determination module 400 includes two stages of 4-input min1-min2 modules 430 (in the (X-1)$^{th}$ and X$^{th}$ stages). The 4-input min1-min2 modules 430 each include two sets of value inputs for receiving four values from the previous stage of the tree structure and two value outputs for outputting the two values based on comparison of the four input values. The 4-input min1-min2 modules 430 each are configured to compare two pairs of values received via the two sets of value inputs, and to output the two values from the two value outputs in a manner for indicating (1) the first minimum value (Min$_1$), which is the smallest of two of the values in a first pair of values received by the 4-input min1-min2 module 430 and provides the magnitude of the smallest value of the M |β$_i$| values received by the minimum determination module 400 and (2) the second minimum value (Min$_2$), which is smallest of the remaining three values received by the 4-input min1-min2 modules 430 and provides an approximation of the magnitude of the next-smallest value of the M |β$_i$| values received by the minimum determination module 400. Additionally, each 4-input min1-min2 module also includes (1) two index inputs for receiving two indexes associated with values received via the two sets of value inputs, respectively and (2) one index output for outputting the one of the two received indexes associated with the first minimum value (Min$_1$) determined by 4-input min1-min2 modules 430 (which, as discussed herein, is indicative of a location, within the M |β$_i$| values received by the minimum determination module 400, of the |β$_i$| value providing the magnitude of the smallest value of the M |β$_i$| values received by the minimum determination module 400). As discussed further below, the index may be propagated in various ways (e.g., the index is log 2(M) bits long in which case we simply output one of the 2 received indexes in each stage, the index grows by 1 bit at each stage (in which case one of the 2 received indexes is output and an extra bit is further appended depending on which input was minimum), or the like). An exemplary 4-input min1-min2 module 430', which is suitable for use as a 4-input min1-min2 module 430, is depicted in FIG. 4.

The 4-input min1-min2 module 430' includes a first minimum determination element 431$_1$, a second minimum determination element 431$_2$, four multiplexers 432$_1$-432$_4$ (collectively, multiplexers 432), and an index multiplexer 433. The first minimum determination element 431$_1$ receives the two values (denoted as Min1$_A$ and Min1$_B$) from the previous stage of the tree structure, compares the two values to determine which of the two values is smaller, and outputs a signal (denoted as Ind[q], e.g., typically "1" or "0" although any suitable signal may be used) indicative as to which of the two values is smaller. The first multiplexer 432$_1$ receives two values (denoted as Min1$_A$ and Min1$_B$) from the previous stage of the tree structure, selects the smaller of the two values, and outputs the smaller value as Min$_1$. The second multiplexer 432$_2$ receives two values (denoted as Min1$_A$ and Min1$_B$) from the previous stage of the tree structure, selects the larger of the two values, and outputs the larger value as an input to the second minimum determination element 431$_2$ and as an input to the fourth multiplexer 432$_4$. The third multiplexer 432$_3$ receives two values (denoted as Min2$_A$ and Min2$_B$) from the previous stage of the tree structure and provides an appropriate second input for second minimum determination element 431$_2$. The second minimum determination element 431$_2$, if Min1$_A$<Min1$_B$, compares Min1$_B$ with Min2$_A$ (which is output by third multiplexer 432$_3$) to determine Min$_2$. The second minimum determination element 431$_2$, if Min1$_B$<Min1$_A$, compares Min1$_A$ with Min2$_B$ (which is output by third multiplexer 432$_3$) to determine Min$_2$. The fourth multiplexer 432$_4$ receives the same two input values as the second minimum determination element 431$_2$ and selects the smaller of the two values based on the control signal received from second minimum determination element 431$_2$ and outputs the smaller value as Min$_2$. It is noted that in each stage the Ind[q] bit is appended to the preceding Ind[q-1] . . . Ind[1] to form the entire index of the true minimum value from the set of |β$_i$| values input to minimum determination module 400, which provides an identification of which of the |β$_i$| values input to minimum determination module 400 has a magnitude that corresponds to the true minimum value from the set of values input to minimum determination module 400. It will be appreciated that, although depicted and described with respect to a specific embodiment of a 4-input min1-min2 module 430 (illustratively, exemplary 4-input min1-min2 module 430'), the 4-input min1-min2 module 430 may be implemented in various other ways in order to provide functions of the 4-input min1-min2 module 430 as presented herein.

It will be appreciated that, although primarily depicted and described with respect to specific embodiments of the minimum determination module 200 (illustratively, minimum determination module 300 of FIG. 3 and minimum determination module 400 of FIG. 4), minimum determination module 200 may be implemented using various other types, numbers, and arrangements of modules (e.g., other numbers of minimum modules, minimum modules including more than two inputs (e.g., 3-input blocks over log 3(M) stages, 4-input blocks, over log 4(M) stages, or the like), or the like), min-max modules (e.g., other numbers of min-max modules, min-max modules including other numbers of inputs, or the like), or the like, as well as various combinations thereof). In at least some embodiments, $2^k$ 2-input min-max modules may be provided at the (X-k)th stage, the preceding X-(k+1) stages may be composed of 2-input minimum modules, and the final k stages may be composed of 4-input min1-min2 modules. Various other implementations are contemplated.

Referring again to FIGS. 1 and 2, it will be appreciated that, in at least some embodiments, processing modules 210 of FIG. 2 may be implemented such that, rather than comparing the |β$_i$| values against each other (e.g., as in the minimum determination module 300 of FIG. 3), the |β$_i$| values may be evaluated in a manner for eliminating |β$_i$| values that do not qualify for the status of being the minimum value from among the set of M |β$_i$| values. In at least some embodiments, the |β$_i$| values may be evaluated, in a manner for eliminating |β$_i$| values that do not qualify for the status of being the minimum value from among the set of M |β$_i$| values, based on bitwise comparisons of bits of corresponding bit positions of the |β$_i$| values. In at least some embodiments, for a set of M |β$_i$| values, the first minimum value (Min$_1$) representing the magnitude of the smallest |β$_i$| value from the set of M |β$_i$| values and the second minimum value (Min$_2$) representing an approximation of the magnitude of the next-smallest |β$_i$| value from the set of M |β$_i$| values may be determined by (1) dividing the set of M |β$_i$| values into two equal-sized groups of M/2 |β$_i$| values, (2) for each group of M/2 |β$_i$| values: (2a) evaluating each bit position i (from among the w-1 bit positions of the |β$_i$| values), beginning with the most significant bit (MSB) position and proceeding to the least significant bit (LSB) position, as follows: (2a-1) based on detection of the presence of at least one zero bit at bit position i among the M/2 |β$_i$| values of the group, issue a 'found' signal for bit position i (denoted as f(bit i), which may be "0" when at least one zero bit is identified and "1" when no zero bits are identified); and (2a-2) based on a determination that a 'found' signal is active for the p-th bit position of the M/2 |β$_i$| values of the group (e.g., f(bit p)=0, which is indicative that at least one zero bit was identified), issue a 'disable' (ds$_{p-1}$) signal indicating each |β$_i$| value for which the bit value of the p-th bit position of the |β$_i$| value is equal to "1"; (2b) obtain the minimum |β$_i$| value from among the M/2 |β$_i$| values of the group by concatenating the found signals f(bit p) (e.g., where f(bit p)='0' if at least one zero among the bit set |β$_i$|(bit p) is found, and f(bit p)='1' otherwise); (2c) determine the index of the minimum |β$_i$| value from among the M/2 |β$_i$| values of the group by binary encoding the position of the first |β$_i$| value of the group that did not receive any 'disable' signals; and (3) determine the first minimum value (Min$_1$) and the second minimum value (Min$_2$) using a comparator to compare the two minimum values determined based on processing of the two equal-sized groups of M/2 |β$_i$| values. An exemplary embodiment of a processing module of the minimum determination module of FIG. 2 that is configured to perform processing of a group of M/2 |β$_i$| values for determining the minimum |β$_i$| value from among the M/2 |β$_i$| values of the group and the index of the minimum |β$_i$| value from among the M/2 |β$_i$| values of the group is depicted and described with respect to FIGS. 5-8. For purposes of clarity, the embodiment of the processing module of the minimum determination module of FIG. 2 that is depicted and described with respect to FIGS. 5-8 is an embodiment in which the CNU 125$_i$ is connected to 16 VNUs 124 (i.e., M=16 and, thus, there are 16 |β$_i$| values to be processed, in two groups of 8 |β$_i$| values each) and each |β$_i$| value is 4 bits in length (i.e., w=5, with one of the bit being for the sign and four bits representing the magnitude, such that four bit positions are evaluated). It is noted that the embodiment of the processing module of the minimum determination module of FIG. 2 that is depicted and described with respect to FIGS. 5-8 also may be adapted for use in other contexts and, more generally, for determining, from among a set of input values, at least one of a magnitude of the minimum value from the set of input values or an identification of the minimum value within the set of input values (and, therefore, also may be referred to as a single minimum determination module or, more generally, as a minimum determination module).

Figure 5:
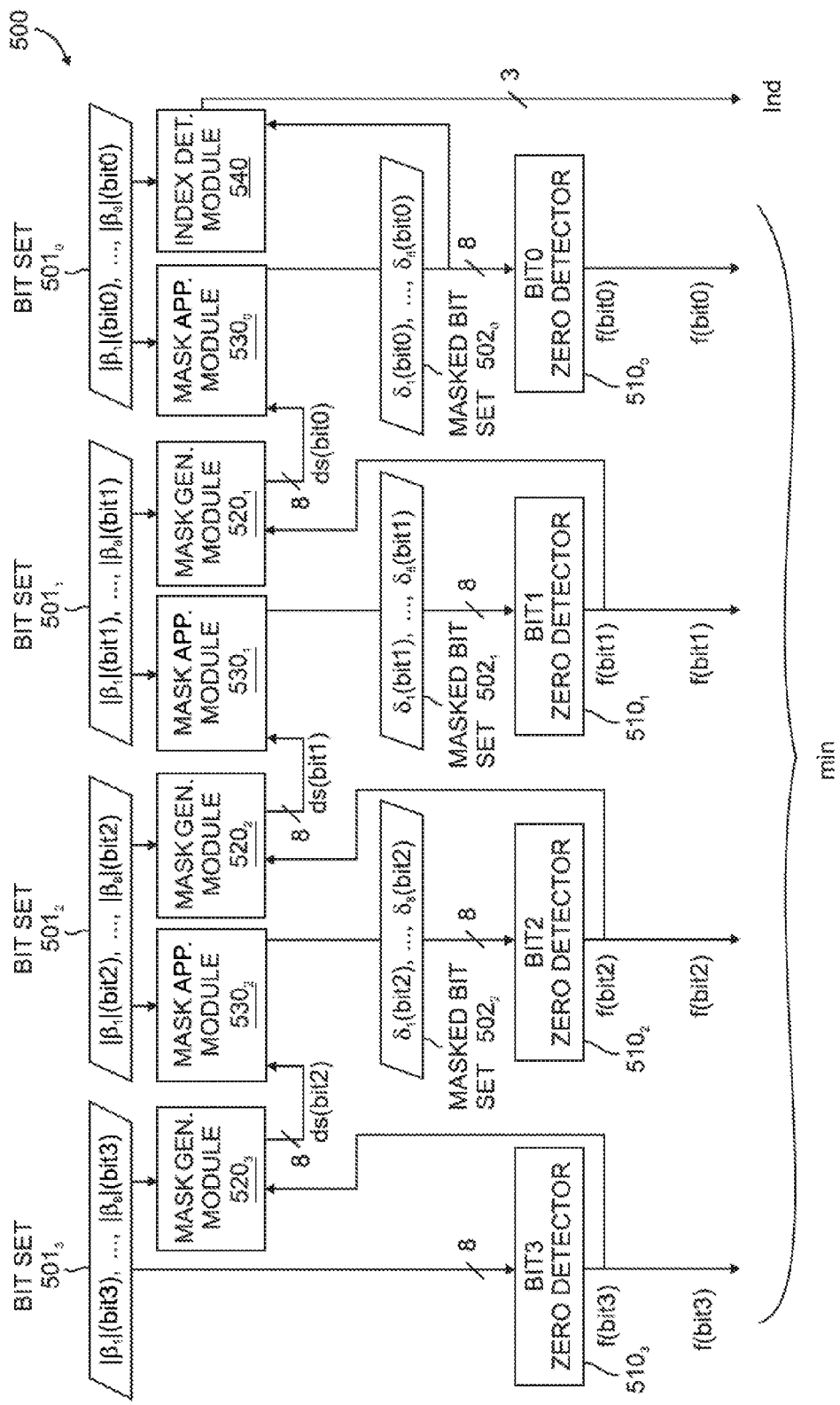
FIG. 5 depicts an exemplary embodiment of a processing module of the minimum determination module of FIG. 2.

FIG. 5 depicts an exemplary embodiment of a processing module of the minimum determination module of FIG. 2. As depicted in FIG. 5, a processing module 500 is configured to receive a group of 8 |β$_i$| values from 8 messages received from 8 VNUs 124, and to output the minimum |β$_i$| value from among the 8 |β$_i$| values of the group and the index of the minimum |β$_i$| value from among the 8 |β$_i$| values of the group. The 8 |β$_i$| values (denoted as |β$_1$|-|β$_8$|) each include four bits (denoted using (bit 0)-(bit 3), where (bit 0) corresponds to the bit position of the LSB and (bit 3) corresponds to the bit position of the MSB. The four bits of the 8 |β$_i$| values are arranged such that bits of the 8 |β$_i$| values corresponding to the same bit position are processed as a group of bits. Accordingly, as depicted in FIG. 5, processing module 500 receives four bit sets 501$_3$-501$_0$ (collectively, bit sets 501), where bit set 501₃ includes the 8 MSBs of the 8 |β$_i$| values of the group (denoted as |β$_1$|(bit 3)–|β$_8$|(bit 3)), bit set 501₂ includes the 8 next MSBs of the 8 |β$_i$| values of the group (denoted as |β$_1$|(bit 2)–|β$_8$|(bit 2)), bit set 501₁ includes the 8 next MSBs of the 8 |β$_i$| values of the group (denoted as |β$_1$|(bit 1)–|β$_8$|(bit 1)), and bit set 501₀ includes the 8 LSBs of the 8 |β$_i$| values of the group (denoted as |β$_1$|(bit 0)–|β$_8$|(bit 0)). The four bit positions associated with the four bit sets 501₃-501₀ have associated therewith zero detector modules 510₃-510₀ (collectively, zero detector modules 510), respectively. The three bit positions of the three MSBs corresponding to bit sets 501₃-501₁ have associated therewith mask generation modules 520₃-520₁ (collectively, mask generation modules 520), respectively. The three bit positions of the three LSBs corresponding to bit sets 501₂-501₀ have associated therewith mask application modules 530₂-530₀ (collectively, mask application modules 530), respectively. The bit position of the LSB, corresponding to bit set 501₀, also has associated therewith an index determination module 540. It will be appreciated that, although omitted from FIG. 5 for purposes of clarity, the various modules of the processing module 500 may be considered to be organized into a set of four modules associated with the four bit positions (e.g., a first module associated with the MSB position that receives bit set 501₃ and that includes zero detector module 510₃ and mask generation module 520₃; a second module associated with the next-most-significant bit position that receives bit set 501₂ and that includes zero detector module 510₂, mask generation module 520₂, and mask application module 530₂; a third module associated with the next-most-significant bit position that receives bit set 501₁ and that includes zero detector module 510₁, mask generation module 520₁, and mask application module 530₁; and a fourth module associated with the LSB position that receives bit set 501₀ and that includes zero detector module 510₀, mask application module 530₀, and index determination module 540). It will be appreciated that the various modules of processing module 500 may be organized in various other ways or may be considered to be organized in various other ways. A description of the operation of the various modules of processing module 500 follows.

The processing module 500 processes the group of 8 |β$_i$| values from the 8 messages received from 8 VNUs 124 in order to determine the minimum |β$_i$| value from among the 8 |β$_i$| values of the group (which gives the magnitude of the minimum |β$_i$| value from among the |β$_i$| values of the group, but does not indicate which of the 8 |β$_i$| values of the group corresponds to the minimum |β$_i$| value from among the 8 |β$_i$| values of the group) and the index of the minimum |β$_i$| value from among the |β$_i$| values of the group (which identifies which of the 8 |β$_i$| values of the group corresponds to the minimum |β$_i$| value from among the 8 |β$_i$| values of the group (e.g., a location of minimum |β$_i$| value from among the 8 |β$_i$| values of the group within the 8 |β$_i$| values of the group), but does not indicate the magnitude of the minimum |β$_i$| value from among the 8 |β$_i$| values of the group). The 8 MSBs of bit set 501₃ are provided to zero detector module 510₃, which performs a logical AND operation on the 8 MSBs to produce a corresponding found signal f(bit 3). The found signal f(bit 3) is (a) output as the bit for the 3$^{rd}$ bit position (MSB) of the minimum |β$_i$| value from among the 8 |β$_i$| values being processed by processing module 500 and (b) fed back as an input to the mask generation module 520₃ that is associated with the 8 MSBs of bit set 501₃. The found signal f(bit 3) is set equal to "0" based on detection of the presence of at least one zero bit among the 8 bits of bit set 501₃, and is set to "1" otherwise. The mask generation module 520₃ receives the 8 MSBs of bit set 501₃ and the found signal f(bit 3) output from zero detector module 510₃, and uses the 8 MSBs of bit set 501₃ and the found signal f(bit 3) to produce a disable signal (denoted as ds(bit 2) which is an 8-bit signal defined as ds(bit 2)=ds$_1$(bit 2), ds$_2$(bit 2), . . . , ds$_8$(bit2) where the subscripts correspond to the 8 |β$_i$| values) for use by mask application module 530₂ associated with the bit set 501₂ including the next MSBs of the 8 |β$_i$| values. The mask generation module 520₃ produces the disable signal ds(bit 2) by, based on a determination that the found signal f(bit 3) is active (e.g., found signal f(bit 3)='0'), set a corresponding bit of the disable signal ds(bit 2) equal to "1" for each bit of bit set 501₃ that is equal to "1". For example, if the 8 MSBs of bit set 501₃ are 10011011 and f(bit 3) is "0" (indicative that the 8 MSBs of bit set 501₃ included at least one "0"), then ds(bit 2) will be 10011011. The 8 bits of bit set 501₂, rather than being provided directly to zero detector module 510₂, are provided to the mask application module 530₂ associated with the bit set 501₂. The mask application module 530₂ associated with the bit set 501₂ receives the 8 bits of bit set 501₂ and the disable signal ds(bit 2) generated by mask generation module 520₃, and masks the 8 bits of bit set 501₂ with the 8 bits of the disable signal ds(bit 2) to produce a masked bit set 502₂ (including 8 masked bits, denoted as δ$_1$(bit 2)-δ$_8$(bit 2)) which is provided to the zero detector module 510₂ instead of the 8 bits of bit set 501₂. The disable signal ds(bit 2) turns into '1' the 8 bits of bit set 501₂ (namely, bits |β$_k$|(bit 2)) for which the corresponding bits of bit set 501₃ (namely, bits |β$_k$|(bit 3)) are equal to '1' if, for at least one value of 'm' (where m≠k), |β$_m$|(bit 3) equals '0'. The 8 masked bits of masked bit set 502₂ are provided to zero detector module 510₂ associated with the bit set 501₂, which performs a logical AND operation on the 8 masked bits to produce a corresponding found signal f(bit 2). The found signal f(bit 2) is (a) output as the bit for the 2$^{nd}$ bit position (second MSB) of the minimum |β$_i$| value from among the 8 |β$_i$| values being processed by processing module 500 and (b) fed back as an input to the mask generation module 520₂ that is associated with the 8 bits of bit set 501₂. The found signal f(bit 2) is set equal to "0" based on detection of the presence of at least one zero bit among the 8 bits of masked bit set 502₂, and is set to "1" otherwise. The mask generation module 520₂ receives the 8 bits of bit set 501₂ and the found signal f(bit 2) output from zero detector module 510₂, and uses the 8 bits of bit set 501₂ and the found signal f(bit 2) to produce a disable signal (denoted as ds(bit 1) which is an 8-bit signal defined as ds(bit 1)=ds$_1$(bit 1), ds$_2$(bit 1), . . . , ds$_8$(bit1) where the subscripts correspond to the 8 |β$_i$| values) for use by mask application module 530₁ associated with the bit set 501₁ including the next MSBs of the 8 |β$_i$| values. The processing then continues as discussed above in order to produce a corresponding found signal f(bit 1) which is output as the bit for the 1$^{st}$ bit position (third MSB) of the minimum |β$_i$| value from among the 8 |β$_i$| values being processed by processing module 500 and to produce a corresponding found signal f(bit 0) which is output as the bit for the 0$^{th}$ bit position (LSB) of the minimum |β$_i$| value from among the 8 |β$_i$| values being processed by the processing module 500. In this manner, the concatenation of the found signals f(bit 3)-f(bit 0) provides the minimum |β$_i$| value from among the 8 |β$_i$| values of the group. Additionally, the index determination module 540, which is associated with the bit position of the LSB, is configured to determine the index of the minimum |β$_i$| value from among the 8 |β$_i$| values of the group. The index determination module 540 receives the 8 bits of bit set $501_0$ and the 8 bits of the masked bit set $502_0$, and uses a truth table to determine the index of the minimum $|\beta_i|$ value from among the 8 $|\beta_i|$ values of the group. Accordingly, as depicted in FIG. 5, the processing module 500 outputs the minimum $|\beta_i|$ value from among the 8 $|\beta_i|$ values of the group and the index of the minimum $|\beta_i|$ value from among the 8 $|\beta_i|$ values of the group.

Figure 6:
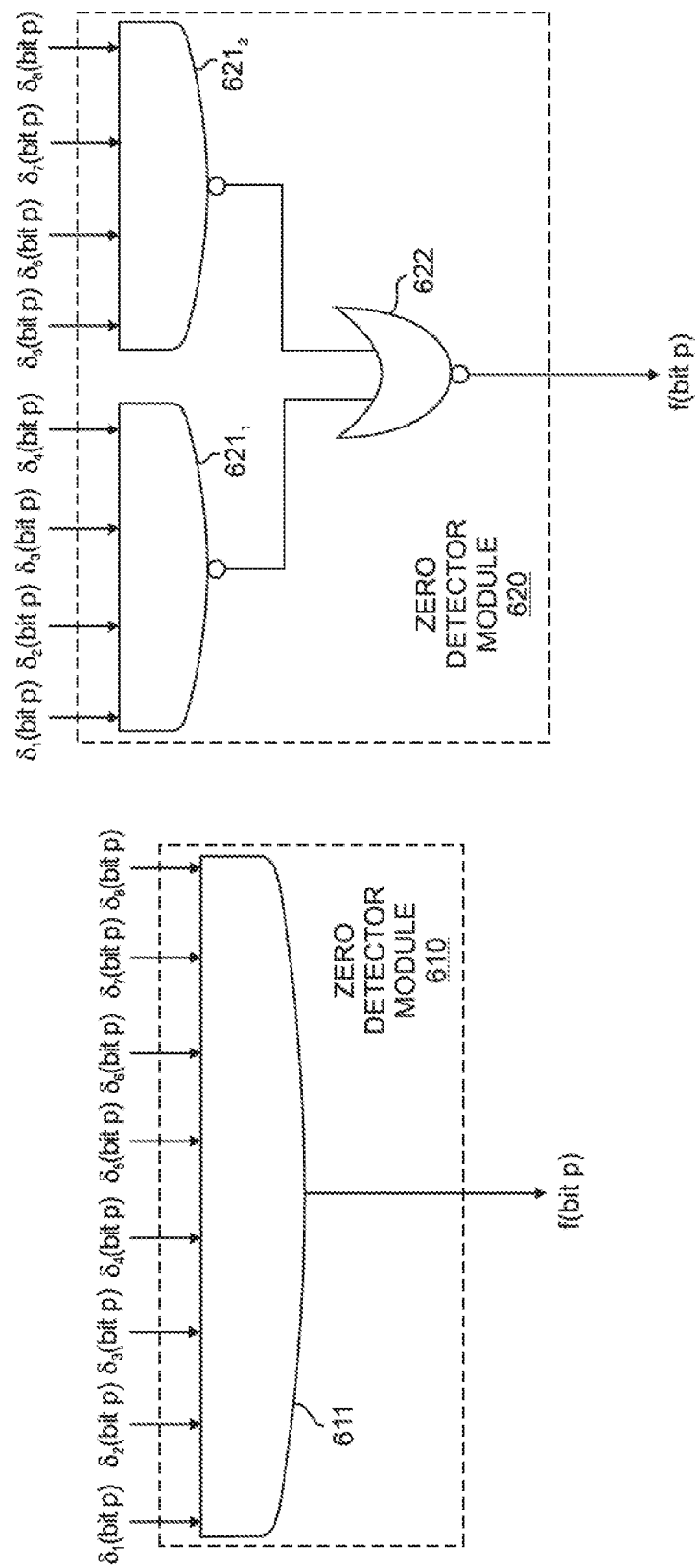
FIG. 6 depicts exemplary embodiments of a zero detector module for the processing module of FIG. 5.

FIG. 6 depicts exemplary embodiments of a zero detector module for the processing module of FIG. 5. As discussed above, the zero detector module 510 for a given bit position provides a logical AND function for determining whether any of the bits of the given bit position are zeros. As will be understood, a logical AND operation for 8 input bits may be provided in various ways. In one embodiment, for example, a zero detector module 610 may be implemented using a single 8-input AND gate 611. The 8-input AND gate 611 receives the bits of the bit set for bit position p and outputs the corresponding found signal f(bit p). In one embodiment, for example, a zero detector module 620 may be implemented using a pair of 4-input NAND gates $621_1$ and $621_2$ and a 2-input NOR gate 622. The 4-input NAND gates $621_1$ and $621_2$ each receive respective portions of the bits of the bit set for bit position p and output respective intermediate bits that are provided to the inputs of the 2-input NOR gate 622, which then outputs the corresponding found signal f(bit p). It will be appreciated that, although primarily depicted and described with respect to the bit set for bit position p being a masked bit set (illustratively, $\delta_1$(bit p)-$\delta_8$(bit p)), the bit set for bit position p in the case of the MSB will be the bit set including bits received from the 8 VNUs (namely, $|\beta_1|$(bit p)-$|\beta_8|$(bit p)).

Figure 7:
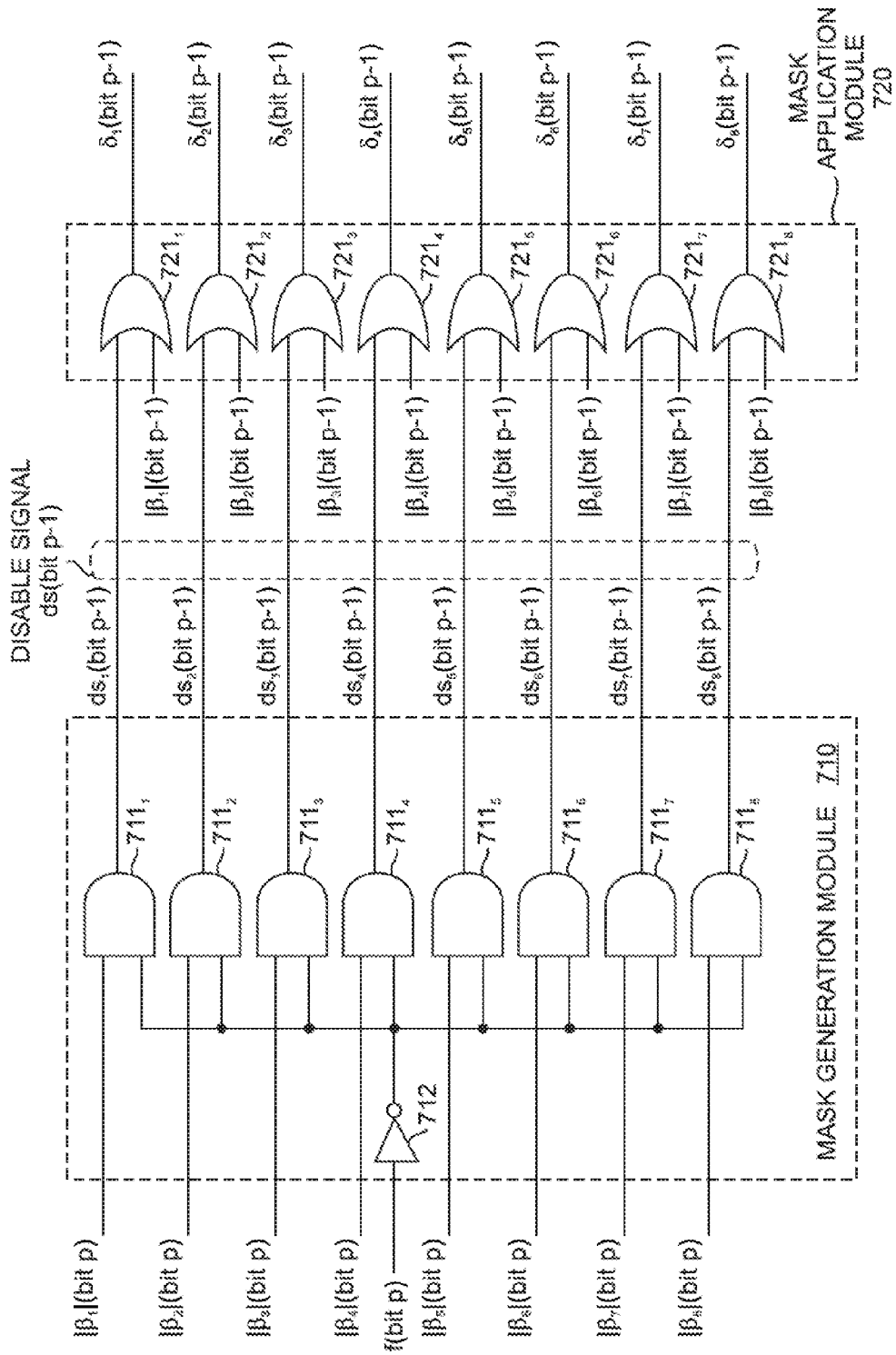
FIG. 7 depicts an exemplary embodiment of masking modules for the processing module of FIG. 5.

FIG. 7 depicts an exemplary embodiment of masking modules for the processing module of FIG. 5. As depicted in FIG. 7, the masking modules include a mask generation module 710 and a mask application module 720, which are suitable for use as the mask generation modules 520 and the mask application modules 530 of processing module 500 of FIG. 5, respectively. The mask generation module 710 is associated with a bit position p and the mask application module 720 is associated with an adjacent bit position p-1.

The mask generation module 710 receives the 8 bits of the bit set for bit position p (denoted as $|\beta_1|$(bit p)-$|\beta_8|$(bit p)) and the found signal f(bit p) output from the zero detector of bit position p, and produces a disable signal ds(bit p-1) for use by mask application module 720 associated with bit position p-1. The mask generation module 710 includes 8 AND gates $711_1$-$711_8$ (collectively, AND gates 711) and an inverter 712. The AND gates 711 each include two inputs and one output, respectively. The inverter 712 includes a single input and a single output. The 8 bits of the bit set (namely, $|\beta_1|$(bit p)-$|\beta_8|$(bit p)) are input into first inputs of the 8 AND gates $711_1$-$711_8$, respectively. The input of the inverter 712 receives found signal f(bit p) and outputs an inverted found signal f'(bit p). The inverted found signal f'(bit p) is input into each of the second inputs of the 8 AND gates $711_1$-$711_8$, respectively. If the found signal f(bit p) for bit position p is a "0" (indicative that at least one of the bits at bit position p was a "0") then the inverted found signal f'(bit p) is a "1" such that, for each of the $|\beta_i|$(bit p) values of bit position p that were "1", the associated AND gate $711_i$ will ensure that the corresponding disable signal $ds_i$ (bit p-1) for the next bit position p-1 is also a "1" since those $|\beta_i|$ values cannot be the minimum value of the set of $|\beta_i|$ values and, thus, should not be evaluated as part of the zero detection performed at the next bit position p-1. If the found signal f(bit p) is a "1" (indicative that all of the bits at bit position p were "1") then the inverted found signal f'(bit p) is a "0" such that, regardless of the $|\beta_i|$(bit p) values of bit position p that were "1", the associated AND gates 711 will ensure that the corresponding disable signals ds(bit p-1) for the next bit position p-1 are "0". The outputs of the 8 AND gates $711_1$-$711_8$ form the disable signal ds(bit p-1) for use by mask application module 720 associated with bit position p-1.

The mask application module 720 receives the 8 bits of the bit set for bit position p-1 (denoted as $|\beta_1|$(bit p-1)-$|\beta_8|$(bit p-1)) and the disable signal ds(bit p-1) from mask generation module 710, and produces the 8 bits of the masked bit set for bit position p-1 (denoted as masked bits $\delta_1$(bit p-1)-$\delta_8$(bit p-1)). The mask application module 720 includes 8 OR gates $721_1$-$721_8$ (collectively, OR gates 721), each of which includes two inputs and one output, respectively. The 8 bits of the bit set (namely, $|\beta_1|$(bit p-1)-$|\beta_8|$(bit p-1)) are input into first inputs of the 8 OR gates $721_1$-$721_8$, respectively. The 8 bits of the disable signal ds(bit p-1) are input into second inputs of the 8 OR gates $721_1$-$721_8$, respectively. If the disable signal $ds_i$ (bit p-1) for the bit position p-1 is a "1" (indicative that the bit $|\beta_i|$(bit p) of the previous bit position was "1" even though at least one other bit $|\beta_j|$(bit p) of the previous bit position was "0" then the associated OR gate $721_i$ ensures that the corresponding masked bit $\delta_i$(bit p-1) is a "1" (regardless of whether the associated bit $|\beta_i|$(bit p-1) of bit position p-1 is "1" or "0") and, thus, that the associated $|\beta_i|$ value cannot be the minimum value of the set of $|\beta_i|$ values (i.e., even though the current bit $|\beta_i|$(bit p-1) of bit position p-1 is a "0", it was previously determined that the $|\beta_i|$ value cannot be the minimum value of the set of $|\beta_i|$ values since at least one other $|\beta_i|$ value from the set of $|\beta_i|$ values has a "0" at a more significant bit position while the $|\beta_i|$ value has a "1" at that more significant bit position). In other words, even though the current bit $|\beta_i|$(bit p-1) of bit position p-1 of the given $|\beta_i|$ value is a "0", this "0" value is blocked, or masked, from being considered by the zero detector module for bit position p-1 since, as noted above, it was previously determined that the given $|\beta_i|$ value cannot be the minimum value of the set of $|\beta_i|$ values since at least one other $|\beta_i|$ value from the set of $|\beta_i|$ values has a "0" at a more significant bit position while the given $|\beta_i|$ value has a "1" at that more significant bit position. The outputs of the 8 OR gates $721_1$-$721_8$ form the masked bit set (namely, $\delta_1$(bit p-1)-$\delta_8$(bit p-1)) which is provided to the zero detector module for bit position p-1.

FIG. 8 depicts an exemplary truth table for an index determination module of the processing module of FIG. 5. More specifically, truth table 800 may be used by index determination module 540 of processing module 500 in order to determine the three-bit index value (denoted as Ind output by processing module 500) that corresponds to the minimum $|\beta_i|$ value from among the 8 $|\beta_i|$ values of the group (denoted as min output by processing module 500). As depicted in FIG. 8, truth table 800 provides a set of mappings of sets of values of the masked bit set (namely, $\delta_1$(bit 0)-$\delta_8$(bit 0)) for bit position 0 (LSB) to corresponding sets of values of the bits of the index value associated with the minimum $|\beta_i|$ value from among the 8 $|\beta_i|$ values of the group. For example, where $\delta_1$(bit 0)=0 (illustrated in the second row of truth table 800), the values of the bits of the index value are determined to be 000 (corresponding to a particular one of the $|\beta_i|$ values from among the 8 $|\beta_i|$ values of the group). For example, where $\delta_1$(bit 0)=1 and $\delta_2$(bit 0)=0 (illustrated in the second row of truth table 800), the values of the bits of the index value are determined to be 001 (corresponding to a particular one of the $|\beta_i|$ values from among the 8 $|\beta_i|$ values of the group). For example, where the $\delta_1$(bit 0)-$\delta_7$(bit 0) values are all "1"s and $\delta_8$(bit 0)=0 (illustrated in the eighth row of truth table 800), the values of the bits of the index value are determined to be 111 (corresponding to a particular one of the $|\beta_i|$ values from among the 8 $|\beta_i|$ values of the group). It is noted that, since there is always at least one survivor input value equal to the minimum value, processing unit 500 does not allow all 8 of the $\delta_1$(bit 0) values to be "1"s (and, thus, this is not reflected in table 800 of FIG. 8).

Figure 9:
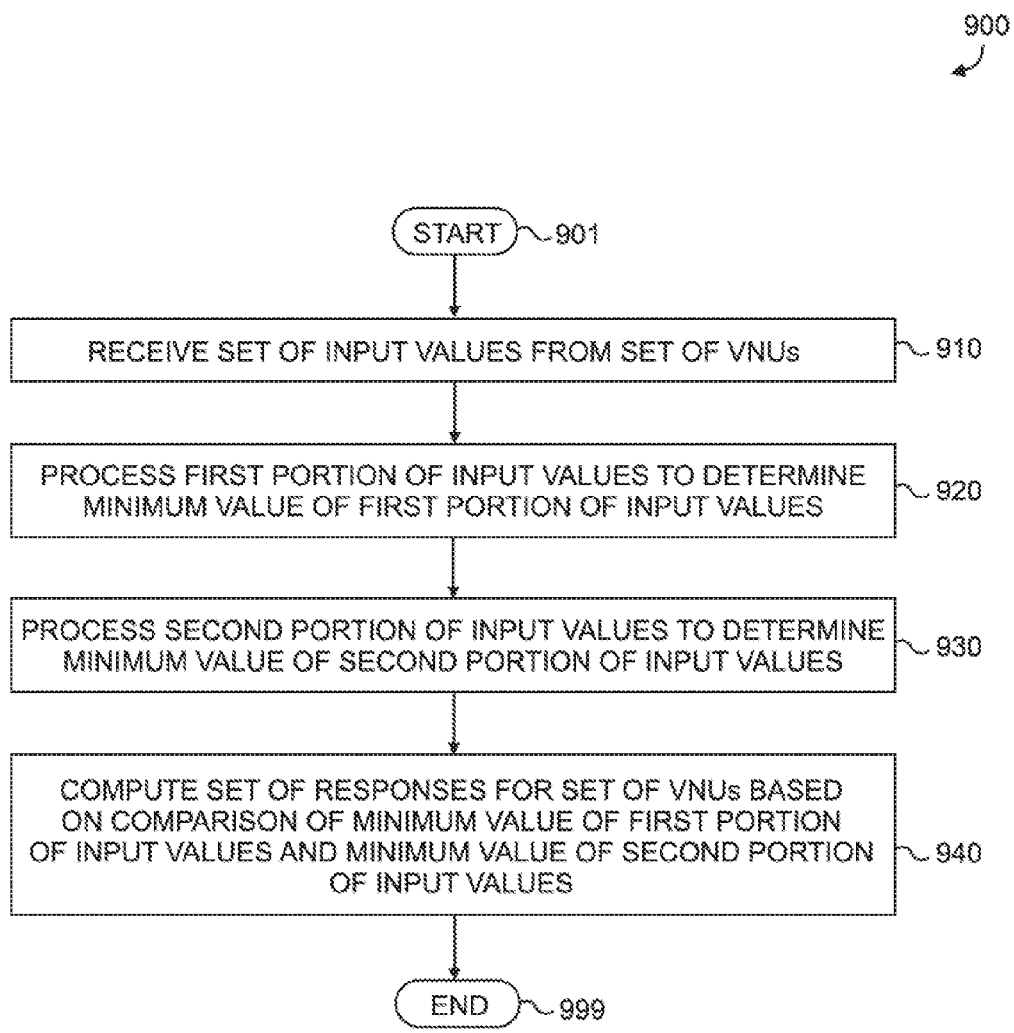
FIG. 9 depicts an exemplary embodiment of a method for computing a set of responses for a set of VNUs based on a set of input values received from the set of VNUs.

FIG. 9 depicts an exemplary embodiment of a method for computing a set of responses for a set of VNUs based on a set of input values received from the set of VNUs. It will be appreciated that, although primarily depicted and described as being performed serially, at least a portion of the steps of method 900 may be performed contemporaneously or in a different order than as depicted in FIG. 9. At step 901, method 900 begins. At step 910, a set of input values is received from a set of VNUs. The set of input values may be received at a CNU. At step 920, a first portion (e.g., half or non-half) of the input values are processed to determine a minimum value of the first portion of input values. This may include a determination of a magnitude of the minimum value of the first portion of input values and identification (typically denoted herein using "index" or Ind) of which of the input values in the first portion of input values corresponds to the minimum value of the first portion of input values (which could be used to read the magnitude of the value at the indicated location). At step 930, a second portion (e.g., half or non-half, and the remaining portion of values not processed at step 920) of the input values are processed to determine a minimum value of the second portion of input values. This may include a determination of a magnitude of the minimum value of the second portion of input values and identification (typically denoted herein using "index" or Ind) of which of the input values in the second portion of input values corresponds to the minimum value of the second portion of input values. At step 940, a set of responses for the set of VNUs is computed based on comparison of the minimum value of the first portion of input values and the minimum value of the second portion of input values. The computation of the set of responses for the set of VNUs based on the comparison of the minimum value of the first portion of input values and the minimum value of the second portion of input values may include a comparison of a magnitude of the minimum value of the first portion of input values and a magnitude of the minimum value of the second portion of input values. The computation of the set of responses for the set of VNUs based on the comparison of the magnitude of the minimum value of the first portion of input values and the magnitude of the minimum value of the second portion of input values may include determining, based on the comparison of the magnitude of the minimum value of the first portion of input values and the magnitude of the minimum value of the second portion of input values, (1) a first minimum value ($Min_1$) for use in computing the set of responses for the set of VNUs (e.g., the magnitude of the lesser of the minimum value of the first portion of input values and the minimum value of the second portion of input values as determined based on the comparison, which gives the magnitude of the smallest value in the set of input values), (2) a second minimum value ($Min_2$) for use in computing the set of responses for the set of VNUs (e.g., the magnitude of the greater of the minimum value of the first portion of input values and the minimum value of the second portion of input values as determined based on the comparison, which represents an approximation of the next-smallest value in the set of input values), and (3) the location ($Ind_1$) of the first minimum value ($Min_1$) giving the smallest value in the set of input values (namely, the location identified in the first portion of input values or the location identified in the second portion of input values, depending on whether the first minimum value ($Min_1$) for use in computing the set of responses for the set of VNUs is identified in the first portion of input values or the second portion of input values). The computation of the set of responses for the set of VNUs based on the comparison of the magnitude of the minimum value of the first portion of input values and the magnitude of the minimum value of the second portion of input values may include computing the set of responses for the set of VNUs based on (1) the first minimum value ($Min_1$) giving the magnitude of the smallest value in the set of input values, (2) the second minimum value ($Min_2$) representing an approximation of the magnitude of the next-smallest value in the set of input values, and (3) the location ($Ind_1$) of the first minimum value ($Min_1$) giving the magnitude of the smallest value in the set of input values. The computation of the set of responses for the set of VNUs also may be based on the location of the second minimum value ($Min_2$) having the approximation of the magnitude of the next-smallest value in the set of input values. At step 999, method 900 ends.

It will be appreciated that, although primarily depicted and described herein with respect to embodiments in which numbers are represented using a sign-magnitude representation and the magnitude portions of the numbers are compared for determining the first minimum value and an approximation of the second minimum value, in at least some embodiments various modules depicted and described herein may be used (or adapted for use) for direct comparisons of the numbers (i.e., direct comparisons of the sign-magnitude representations of the numbers, including both the sign and magnitude portions of the numbers). For example, if, by the used sign-magnitude convention, the sign bit value '0' represents a negative number, then the sign bit can be considered to be the MSB and processed according to the description of minimum determination module 400. Alternatively, for example, if the sign bit value '1' represents a negative number, then the sign bits of all input numbers should be inverted and the inverted sign bits can be processed by the minimum determination module 400 as their MSBs. It will be appreciated that other mechanisms for handling sign-magnitude representations of numbers may be supported for use in determining the first minimum value and an approximation of the second minimum value.

It will be appreciated that, although primarily depicted and described herein with respect to embodiments in which the numbers that are processed for determining the first minimum value and an approximation of the second minimum value include sign and magnitude portions, in at least some embodiments various modules depicted and described herein may be used (or adapted for use) for determining the first minimum value and an approximation of the second minimum value for numbers that do not include a sign portion or for determining the first minimum value and an approximation of the second minimum value for numbers independent or irrespective of whether the numbers include a sign portion or merely represent magnitudes.

It will be appreciated that, although primarily depicted and described herein as determining an approximation of the second minimum value ($Min_2$) given a set of values, the determination of the second minimum value ($Min_2$) also may be said to be a determination of at least an approximation of the second minimum value ($Min_2$) since the reference to "at least" may be used to cover the fact that, in at least some cases, the second minimum value ($Min_2$) will be the true second-smallest value of all of the values in the set of values.

It will be appreciated that, although primarily depicted and described herein with respect to embodiments applied within the context of an LDPC decoder (e.g., in which evaluation of a set of input values to determine a smallest value of the set of input values and an approximation of a next-smallest value of the set of input values is performed for identifying the first minimum value ($Min_1$) and second minimum value ($Min_2$) for use by a CNU in computing a set of responses to a set of VNUs from which the input values were received), various embodiments depicted and described herein may be used within various other contexts (e.g., other devices, environments, technologies, or the like) for evaluating a set of input values to determine a smallest value of the set of input values and an approximation of a next-smallest value of the set of input values. Accordingly, a more general embodiment of a method for evaluating a set of input values to determine a smallest value of the set of input values and an approximation of a next-smallest value of the set of input values is depicted and described in FIG. 10.

Figure 10:
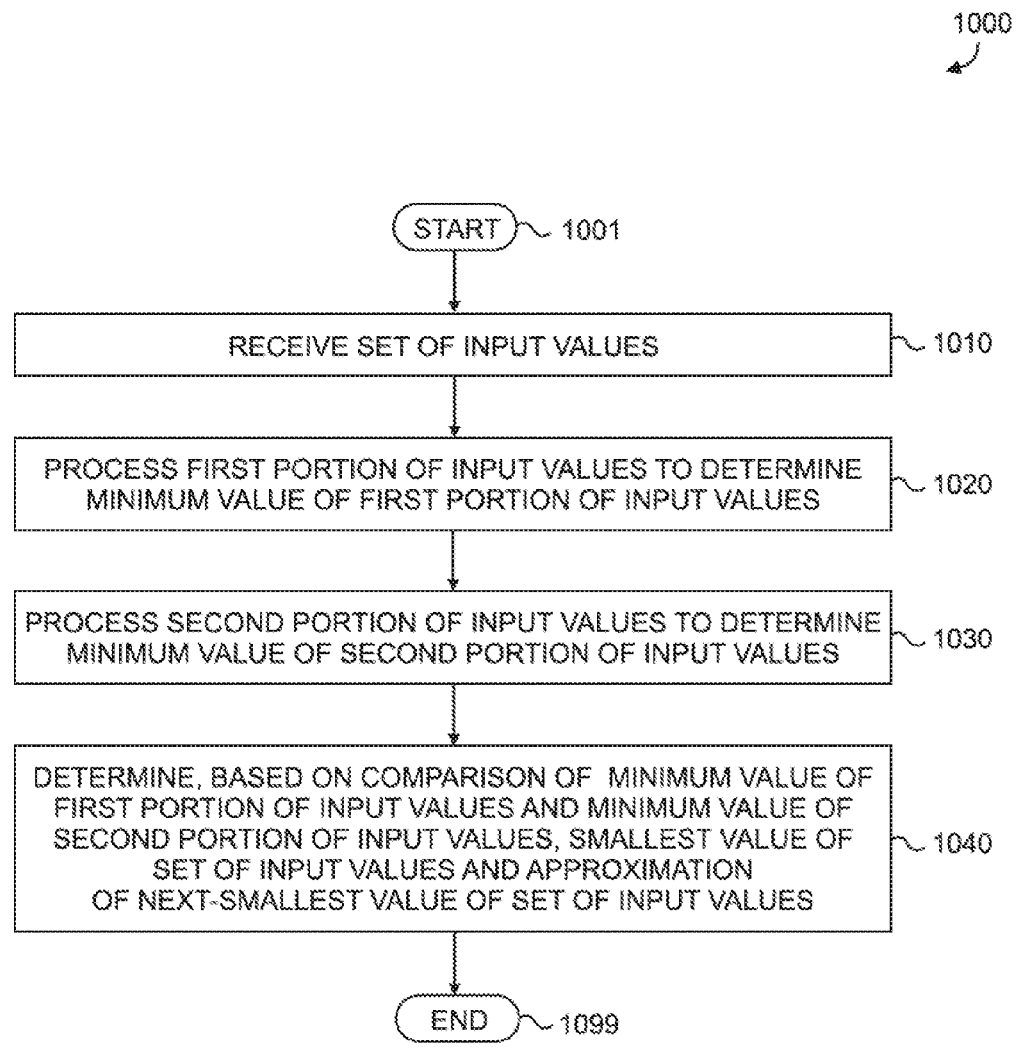
FIG. 10 depicts an exemplary embodiment of a method for evaluating a set of input values to determine a smallest value of the set of input values and an approximation of a next-smallest value of the set of input values.

FIG. 10 depicts an exemplary embodiment of a method for evaluating a set of input values to determine a smallest value of the set of input values and an approximation of a next-smallest value of the set of input values. It will be appreciated that, although primarily depicted and described as being performed serially, at least a portion of the steps of method 1000 may be performed contemporaneously or in a different order than as depicted in FIG. 10. It will be appreciated that method 1000 of FIG. 10 may be performed by a minimum determination module 126 of FIG. 1, minimum determination module 200 of FIG. 2, or the like. At step 1001, method 1000 begins. At step 1010, a set of input values is received. At step 1020, a first portion (e.g., half or non-half) of the input values are processed to determine a minimum value of the first portion of input values. This may include at least one of a determination of a magnitude of the minimum value of the first portion of input values and an identification (typically denoted herein using "index" or Ind) of which of the input values in the first portion of input values corresponds to the minimum value of the first portion of input values (i.e., the specific input value in the first portion of input values that has a magnitude equal to the magnitude of the minimum value of the first portion of input values). At step 1030, a second portion (e.g., half or non-half, and the remaining portion of values not processed at step 1020) of the input values are processed to determine a minimum value of the second portion of input values. This may include at least one of a determination of a magnitude of the minimum value of the second portion of input values and an identification (typically denoted herein using "index" or Ind) of which of the input values in the second portion of input values corresponds to the minimum value of the second portion of input values (i.e., the specific input value in the second portion of input values that has a magnitude equal to the magnitude of the minimum value of the second portion of input values). At step 1040, a smallest value of the set of input values and an approximation of a next-smallest value of the set of input values are determined based on a comparison of the minimum value of the first portion of input values and the minimum value of the second portion of input values. The determination of the smallest value of the set of input values may include at least one of a determination of a magnitude of the smallest value of the set of input values or a determination of an indication of which of the values of the set of values has a magnitude of the smallest value of the set of values. The determination of the approximation of the next-smallest value of the set of input values may include at least one of a determination of a magnitude of the approximation of the next-smallest value of the set of input values or a determination of an indication of which of the values of the set of values has a magnitude of the approximation of the next-smallest value of the set of values. At step 1099, method 1000 ends.

Figure 11:
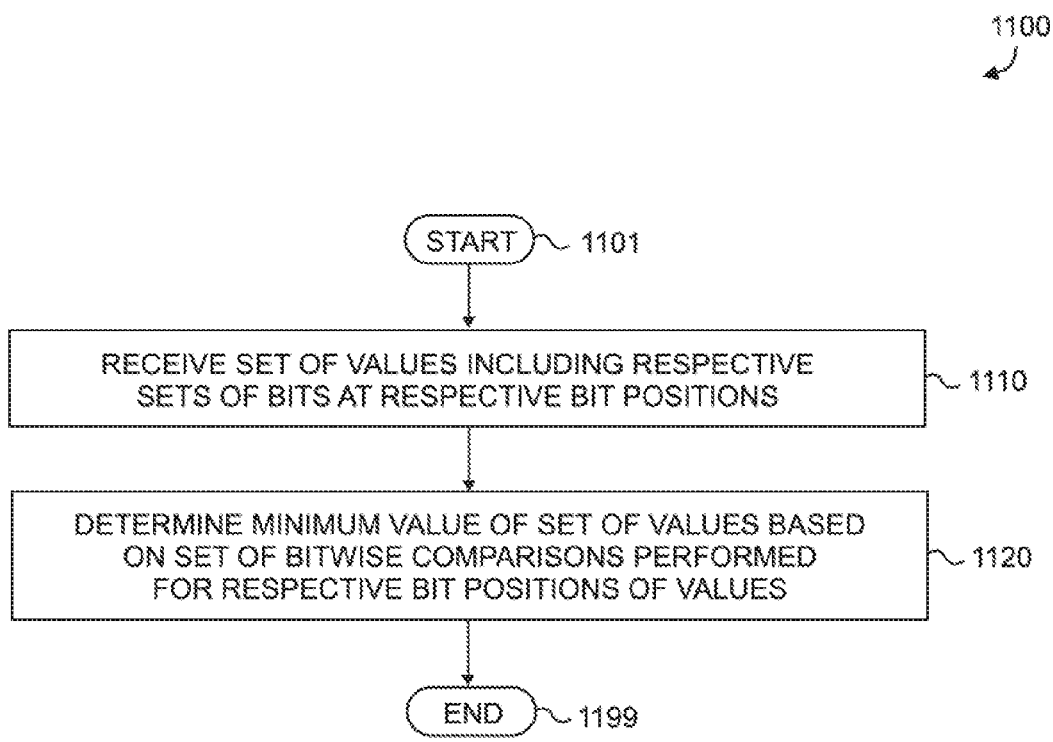
FIG. 11 depicts an exemplary embodiment of a method for evaluating a set of values to determine a minimum value of the set of values.

FIG. 11 depicts an exemplary embodiment of a method for evaluating a set of values to determine a minimum value of the set of values. It will be appreciated that, although primarily depicted and described as being performed serially, at least a portion of the steps of method 1100 may be performed contemporaneously or in a different order than as depicted in FIG. 11. It will be appreciated that method 1100 of FIG. 11 may be performed by a processing module 210 of FIG. 2, a processing module 500 of FIG. 5, or the like.

At step 1101, method 1100 begins.

At step 1110, a set of values is received. The set of values may be received from any suitable source of values.

At step 1120, a minimum value of the set of values is determined. The minimum value of the set of values may be determined based on bitwise comparisons of bits of the values on a per bit position basis. The minimum value of the set of values may be determined based on bitwise comparisons of bits of the values on a per bit position basis beginning with the most significant bit position of the values (and, thus, the most significant bits of the values) and proceeding toward the least significant bit position (and, thus, the least significant bits of the values). The bitwise comparisons on a bit position basis may be performed as depicted and described with respect to FIGS. 5-8.

The minimum value of the set of values may be determined based on bitwise comparisons by using the bitwise comparisons to determine at least one of a magnitude of the minimum value of the set of values or an indication of which of the values of the set of values has a magnitude of the minimum value of the set of values.

In at least some embodiments, only the magnitude of the minimum value of the set of values may be determined without determining which of the values in the set of values has that minimum magnitude (e.g., for a set of input values including 2, 6, 7, 1, 4, determination of only the magnitude may only provide an indication that the minimum value has a magnitude of "1" without an indication that the fourth value in the set of values is the value which has that minimum magnitude). In at least some embodiments, a determination of which of the values in the set of values has that minimum magnitude (e.g., in the above example, determining that the fourth value in the set of values is the value which has the determined minimum magnitude) also may be performed (e.g., based on bitwise comparisons, by searching the set of values to identify which of the values has that determined minimum magnitude, or the like).

In at least some embodiments, only an indication of which of the values of the set of values has a magnitude of the minimum value of the set of values may be determined without determining the magnitude of the minimum value of the set of values that is associated with that indicated value of the set of values (e.g., for a set of input values including 2, 6, 7, 1, 4, determination of only an indication of which of the values of the set of values has a magnitude of the minimum value of the set of values provide an indication that the fourth value in the set of values has the minimum magnitude without an indication that the magnitude of the fourth value is "1"). In at least some embodiments, a determination of the magnitude of the identified value of the set of values (e.g., in the above example, determining that the magnitude of the fourth value in the set of values is "1") also may be performed (e.g., based on bitwise comparisons, by reading or accessing the identified value of the set of values to determine the magnitude of the identified value of the set of values, or the like).

In at least some embodiments, both the magnitude of the minimum value of the set of values and an indication of which of the values in the set of values has that minimum magnitude may be determined (e.g., for a set of input values including 2, 6, 7, 1, 4, determination that the magnitude of the minimum value in the set of values is "1" and an indication that the fourth value in the set of values is the value which has that minimum magnitude). The use of bitwise comparisons of bits of a set of values on a per bit position basis to determine a minimum value of the set of values (both the magnitude of the minimum value of the set of values and an indication of which of the values in the set of values has that minimum magnitude) may be further understood by way of reference to the following example. In this example, assume that there are three values (value v1=100, value v2=011, value v3=010) that need to be evaluated in order to determine the minimum value (which will be value v3=010). A first bitwise comparison is performed at the MSB position for the MSBs of the three values (namely, "1" from value v1, "0" from value v2, and "0" from value v3) to determine whether any of the bits of the three values are "0". Here, since two of the values (value v2 and value v3) have a "0" in the MSB position, it is known that the minimum value of the three values begins with a "0" and, further, that one of the values (namely, value v1) cannot be the minimum value. Accordingly, an output is provided which may be used to indicate that the minimum value of the three values begins with a "0". In the exemplary embodiment of FIG. 5, the logical AND operation on the three MSBs of the three values would result in a found signal f(bit 2)=0 (since at least one of the three MSBs of the three values is "0"), which would be output as the MSB of the minimum value that is ultimately output (although it will be appreciated that output of the MSB of the minimum value may be provided in other ways). Additionally, since it has been determined that value v1 cannot be the minimum value, it is necessary to ensure that value v1 is either not included in the bitwise comparison at the next most significant bit position or at least is disabled from false identification of a "0" at the next most significant bit position (namely, the "0" at the second bit position of value v1 should not be considered in the determination of the minimum value since it has already been determined that value v1 cannot be the minimum). The importance of this is clear from this example, in which both value v2 and value v3, which are still in contention for being identified as being the minimum value, have a "1" in the next most significant bit position (i.e., consideration of value v1 in the bitwise comparison at the next most significant bit position would incorrectly result in identification of a "0" when the actual minimum value does not have a "0" in that bit position). In the exemplary embodiment of FIG. 5, a disable signal is used in order to convert the "0" in the next most significant bit position of value v1 from a "0" to a "1" so as to prevent identification of a "0" at the next most significant bit position due to value v1 (which, again, is particularly important in this example in which the minimum value does not have a "0" in that bit position) without changing the bits of any of the values for which a "0" was identified in the MSB position (as these values are still in contention for being identified as the minimum value). Next, a second bitwise comparison is performed at the second MSB position for the MSBs of the three values. This may be (1) a comparison of "1" from value v2 and "1" from value v3 (e.g., where value v1 has been removed from consideration and is no longer processed in conjunction with bitwise comparisons of subsequent bit positions) or (2) a comparison of "1" for value v1 (where, even though the second bit position of value v1 includes a "0" bit, a disable signal or other suitable mechanism is employed to change the "0" of the second bit position of value v1 to a "1" so as to prevent the actual "0" of the second bit position of value v1 from resulting in an incorrect identification of a "0" in the second bit position of the minimum value), "1" from value v2, and "1" from value v3. In either case, since all of the values of the second bitwise comparison have a "1" in the next most significant bit position (value v2 and value v3, as well as value v1 where a disable signal or other mechanism is used to convert the next most significant bit of value v1 from "0" to "1"), it is known that the minimum value of the three values has a "1" in the next most significant bit position and, thus, an output is provided which may be used to indicate that the minimum value of the three values has a "1" in the next most significant bit position. In the exemplary embodiment of FIG. 5, the logical AND operation performed for the next-most significant bit position of the three values would result in a found signal f(bit 1)=1, which would be output as the next-most significant bit of the minimum value that is ultimately output (although it will be appreciated that output of the next most significant bit of the minimum value may be provided in other ways). Additionally, since neither value v2 nor value v3 has been eliminated from contention as being the minimum value as a result of the second bitwise comparison, it is necessary to ensure that value v2 and value v3 are included in the bitwise comparison at the next most significant bit position (which, in this example is the LSB position). Next, a third and final bitwise comparison is performed at the LSB position for the LSBs of the three values. As with the second bitwise comparison, this may be (1) a comparison of "1" from value v2 and "0" from value v3 (e.g., where value v1 has been removed from consideration and is no longer processed in conjunction with bitwise comparisons of subsequent bit positions) or (2) a comparison of "1" for value v1 (even though the LSB position of value v1 includes a "0" bit, a disable signal or other suitable mechanism is continued to be applied to change the "0" of the LSB position of value v1 to a "1" so as to prevent the actual "0" of the LSB position of value v1 from resulting in an incorrect identification of value v1 as being the minimum value), "1" from value v2, and "0" from value v3. In either case, since one of the values (namely, value v3) has a "0" in the LSB position, it is known that the minimum value of the three values ends with a "0" (and, further, that two of the values (namely, value v1 and value v2) cannot be the minimum value) and, thus, an output is provided which may be used to indicate that the minimum value of the three values has a "0" in the LSB position. In the exemplary embodiment of FIG. 5, the logical AND operation performed for the LSB position of the three values would result in a found signal f(bit 0)=0, which would be output as the LSB of the minimum value that is ultimately output (although it will be appreciated that output of the next most significant bit of the minimum value may be provided in other ways). Thus, at this point, the minimum value has been identified as being "010" (e.g., via concatenation of the three found signals as discussed above). However, the one of the three values having the minimum value "010" has not yet been identified (i.e., it is not known whether the minimum value "010" corresponds to value v1, value v2, or value v3).

The one of the three values having the minimum value "010" may be identified in various ways. In the exemplary embodiment of FIG. 5, an index determination module may use a truth table (e.g., a truth table similar to truth table 800 of FIG. 8) to identify the one of the three values having the minimum value "010". The masked bit set for the LSB position, which is produced based on a combination of the three bits of the LSB position of the three values and the disable signal resulting from the second bitwise comparison, may be used as a key into a truth table in order to identify the one of the three values having the minimum value "010". In this example, $\delta_1$(bit 2)=1, $\delta_1$(bit 1)=1, and $\delta_1$(bit 0)=0, which corresponds to identification of value v3 as being the minimum value "010". Accordingly, value v3 having a value of "010" is identified as the minimum value from among the set of values.

At step 1199, method 1100 ends.

It will be appreciated that, although primarily depicted and described herein with respect to embodiments in which the number of input values (M) in the set of input values being evaluated is a power of 2 (e.g., for determining first and second minimum values, for determining a single minimum value, or the like), various embodiments depicted and described herein may be configured for evaluating a set of input values where the number of input values (M) in the set of input values is not a power of 2. In at least some such embodiments, the module or modules used for evaluating the set of input values may be configured based on a next-higher power of 2 (e.g., for M=12 the module or modules used for evaluating the set of 12 input values may be based on evaluation of a set of 16 input values, for M=60 the module or modules used for evaluating the set of 60 input values may be based on evaluation of a set of 64 input values, or so forth). In at least some such embodiments, configuration of the module or modules used for evaluating the set of input values based on a next-higher power of 2 may use open input connections, dummy variables, or the like.

As discussed herein, various embodiments of the LDPC decoding capability presented herein provide an approximation of conventional LDPC decoders that has bit error rate (BER) performance comparable to that of conventional LDPC decoders while reducing chip area and power consumption (as discussed further below with respect to Table 1) and complexity (as discussed further below with respect to Table 2).

As discussed herein, various embodiments of the LDPC decoding capability presented herein provide an approximation of conventional LDPC decoders that has BER performance comparable to that of conventional LDPC decoders while reducing chip area and power consumption. The use of a logic synthesis tool may be employed to quantify chip area and power consumption benefits for at least some embodiments of the LDPC decoding capability. For example, assuming an 8-input CNU with word length w=4 bits where each design is synthesized in 90 nm CMOS for minimum area at $V_{DD}$=1.2 V, results for a conventional LDPC decoder, an LDPC decoder designed based on the paper entitled "A Bit-Serial Approximate Min-Sum LDPC decoder and FPGA Implementation" by Darabiha et al., and an LDPC decoder based on various embodiments presented herein are presented in Table 1.

TABLE 1

|  | Conventional | Darabiha et al. | Various Embodiments Presented Herein |
| --- | --- | --- | --- |
| Leaf Cells Count | 234 | 226 | 162 |
| Area ($\mu m^2$) | 2172 | 2168 | 1542 |
| Propagation Delay (ns) | 2.90 | 2.14 | 2.11 |
| Dynamic Power Dissipation ($\mu W/MHz$) | 0.61 | 0.57 | 0.43 |
| Leakage Power Dissipation ($\mu W$) | 6.2 | 6.5 | 4.6 |

As discussed herein, various embodiments of the LDPC decoding capability presented herein provide an approximation of conventional LDPC decoders that has BER performance comparable to that of conventional LDPC decoders while reducing complexity. The complexity of a conventional LDPC decoder and an LDPC decoder based on various embodiments presented herein is presented in Table 2. The number of 1-bit 2-to-1 multiplexers (MUX2s) and the number of (w-1)-bit comparators (COMPs) are reduced by a factor about 2 and a factor of about 1.5, respectively. The improvement in the propagation delay depends on $\log_2$ M. The number of operations that are not related to finding the minimums (e.g. XOR operations) is not expected to be affected by embodiments presented herein. It is noted that, knowing the area, power dissipation, and delay of the cells (e.g., MUXs, comparators, and other elements), it is possible to estimate the benefits of various embodiments presented herein using Table 2 for any given LDPC code in a particular CMOS technology. In Table 2, $t_{MUX}$ corresponds to the delay of a MUX2, $t_{COMP}$ corresponds to the delay of a comparator (COMP), and $t_{add}$ corresponds to the delay of an adder.

TABLE 2

|  | Conventional | Various Embodiments Presented Herein |
| --- | --- | --- |
| # MUX2s | $\approx$4M(w − 1) | $\approx$2M (w − 1) |
| # (w − 1)-bit COMPs | 1.5 M − 2 | M − 1 |
| # (w − 1)-bit adders | 2 | 2 |
| # $\log_2$M-bit COMPs | M | M |
| # XORs | 2M − 1 | 2M − 1 |
| Delay | (1 + 2$\log_2$M)$t_{MUX}$ + (2 + $\log_2$M)$t_{COMP}$ + $t_{ADD}$ | (1 + $\log_2$M) $t_{MUX}$ + (1 + $\log_2$M)$t_{COMP}$ + $t_{ADD}$ |

Various advantages of embodiments of the LDPC decoding capability presented herein may be further understood by way of simulations related to a conventional LDPC decoder and an LDPC decoder based on various embodiments presented herein. A simulation was performed using an LDPC (2048,1723) code defined in the 10Gbase-T Ethernet standard and an LDPC(576,288) code defined in the WiMax standard may be used as test bench. The system-level characterization of the decoder was performed in MATLAB. Encoded data was sent through an additive white Gaussian noise (AWGN) channel using non-return-to-zero (NRZ) signaling. For MSA decoding, $S_{norm}$ is 0.75, and w is either 4 or 5 bits. To evaluate the performance of the conventional CNU circuits and CNU circuits designed based on various embodiments presented herein, a combinational logic including sign and normalization calculations was simulated. The CNU circuits of the simulation were implemented in Verilog and then synthesized in a 90-nm CMOS technology. SPICE simulation using the same technology was used to find the relationship between supply voltage, power dissipation, and propagation delay. With respect to BER performance between a conventional LDPC decoder and an LDPC decoder based on various embodiments presented herein, the simulation indicated that (1) for LDPC(2048, 1723), a SNR penalty of 0.1 dB and 0.2 dB was observed for w equal to 4 and 5 bit, respectively, and (2) for LDPC(576, 288), the SNR penalty remained below 0.1 dB. With respect to post-FEC BER versus SNR for word lengths of 4 and 5 in a LDPC(2048, 1723) code, between a conventional LDPC decoder, an LDPC decoder designed based on the paper entitled "A Bit-Serial Approximate Min-Sum LDPC decoder and FPGA Implementation" by Darabiha et al., and an LDPC decoder based on various embodiments presented herein, the simulation indicated that (1) an LDPC decoder based on various embodiments presented herein may have a negligible increase in the required SNR for a given BER over a conventional LDPC decoder and an LDPC decoder designed based on the paper entitled "A Bit-Serial Approximate Min-Sum LDPC decoder and FPGA Implementation" by Darabiha et al. and (2) for a BER lower than $10^{-4}$, the average number of iterations to finish decoding (assuming that early termination is utilized) is about 7% higher and 3% higher for an LDPC decoder based on various embodiments presented herein as compared with a conventional LDPC decoder and an LDPC decoder designed based on the paper entitled "A Bit-Serial Approximate Min-Sum LDPC decoder and FPGA Implementation" by Darabiha et al., respectively (however, although the power dissipation of an LDPC decoder in fact increases with the number of iterations, the power saving in the CNU due to various embodiments presented herein is much larger than 7% and, thus, in total, use of various embodiments presented herein results in lower power dissipation).

As discussed herein, various embodiments of the LDPC decoding capability presented herein provide various advantages over various conventional LDPC decoder designs (as discussed further below with respect to Table 3 depicted below). Table 3 corresponds to implementations of a CNU, of an LDPC(2048,1723) in a fully-parallel decoder implementation, with M=32 inputs and word length w=5 bits. Comparing designs 1 and 3 of Table 3, which are both optimized for chip area, a CNU according to various embodiments presented herein occupies 37% less area than a conventional CNU, and also has lower power dissipation and lower propagation delay than a conventional CNU. In order to compare the two circuits with the same propagation delay, and hence throughput, the design (i.e., design 1) of the conventional CNU was re-synthesized for a higher speed (i.e., design 2). Comparing designs 2 and 3 of Table 3, a CNU according to various embodiments presented herein occupies 44% less area than a conventional CNU. Design 4, which was optimized for the highest throughput, has an area and power dissipation close to that of design 2, but it provides a throughput two times higher than that of design 2. If throughput is not the main concern, but area and power dissipation are the most critical, voltage scaling (VS) can be considered. The supply voltage ($V_{DD}$) of design 3 was lowered to a point where a propagation delay equal to that of design 1 was obtained (i.e., design 5), and a comparison of the results (i.e., design 5) with design 1 shows a three time reduction in power dissipation.

TABLE 3

| | Conventional | | Various Embodiments Presented Herein | | |
|---|---|---|---|---|---|
| | Design Number | | | | |
| | 1 | 2 | 3 | 4 | 5 |
| Optimized For: | Area | Speed | Area | Speed | Area |
| Leaf Cells Count | 1353 | 2054 | 823 | 1961 | 823 |
| Area (μm²) | 12470 | 14157 | 7907 | 14888 | 7907 |
| Supply Voltage (V) | 1.2 | 1.2 | 1.2 | 1.2 | 0.9 |
| Propagation Delay (ns) | 5.11 | 3.8 | 3.77 | 1.8 | 5.11 |
| Dynamic Power Dissipation (μW/MHz) | 3.98 | 3.85 | 2.47 | 3.64 | 1.33 |
| Leakage Power Dissipation (μW) | 36 | 41 | 24 | 57 | 9.6 |

As discussed herein, various embodiments of the LDPC decoding capability presented herein provide reduced power dissipation as compared to that of conventional LDPC decoders. It is noted that the average total power dissipation of the entire LDPC(N,K) decoder (not just the CNU) with early termination can be expressed as:

$$P_{avg} = \frac{I_{avg}}{I_{max}}[NP_{VNU} + (N-K)P_{CNU} + aC_{INT}V_{DD}^2 f_{CK}],$$

where $I_{avg}$ and $I_{max}$ are the average and maximum number of iterations, respectively. $P_{VNU}$ and $P_{CNU}$ are the power dissipation of a VNU and a CNU at a clock frequency of $f_{CK}$, respectively. $C_{INT}$ is the total capacitance of the interconnect wires between CNUs and VNUs, and a is the signal activity factor. $f_{CK}$ is the clock frequency at which the decoder provides the desired throughput after $I_{max}$ iterations. $C_{INT}$ is proportional to the total length of the interconnect wires and, thus, approximately proportional to the square-root of the total area. In a fully-parallel implementation, the total area is proportional to $NA_{VNU}+(N-K)A_{CNU}$, where $A_{VNU}$ and $A_{CNU}$ are the chip area of a VNU and a CNU, respectively. As a result, the average power dissipation can be written as $$P_{avg} = \frac{I_{avg}}{I_{max}}[NP_{VNU} + (N-K)P_{CNU} + \gamma V_{DD}^2 f_{CK}\sqrt{NA_{VNU} + (N-K)A_{CNU}},$$

where parameter γ is a function of technology, chip area utilization factor, and average signal activity factor. The bigger the γ, the higher the impact of interconnects on the average power dissipation. In order to evaluate the impact of various embodiments of the LDPC decoding capability on the power dissipation of a LDPC(2048,1732) decoder, a VNU was synthesized (having a dynamic power dissipation of 3.05 μW/MHz, a leakage power of 14 μW, and an area of 4760 μm²) and the total power dissipation of the decoder was evaluated using assuming design 1 (conventional) and design 5 (various embodiments presented herein) for the CNUs. The use of various embodiments presented herein resulted in lower power dissipation for the LDPC(2048, 1732) decoder.

Figure 12:
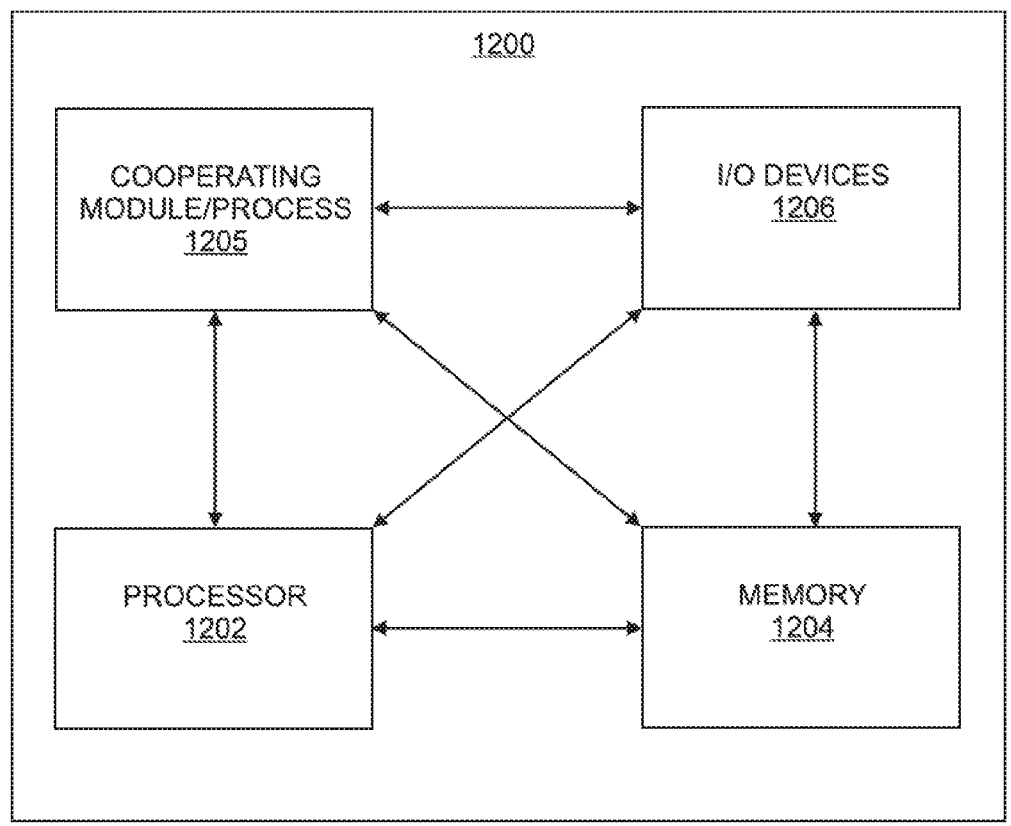
FIG. 12 depicts a high-level block diagram of a computer suitable for use in performing functions presented herein.

FIG. 12 depicts a high-level block diagram of a computer suitable for use in performing functions described herein.

The computer 1200 includes a processor 1202 (e.g., a central processing unit (CPU) and/or other suitable processor(s)) and a memory 1204 (e.g., random access memory (RAM), read only memory (ROM), and the like).

The computer 1200 also may include a cooperating module/process 1205. The cooperating process 1205 can be loaded into memory 1204 and executed by the processor 1202 to implement functions as discussed herein and, thus, cooperating process 1205 (including associated data structures) can be stored on a computer readable storage medium, e.g., RAM memory, magnetic or optical drive or diskette, and the like.

The computer 1200 also may include one or more input/output devices 1206 (e.g., a user input device (such as a keyboard, a keypad, a mouse, and the like), a user output device (such as a display, a speaker, and the like), an input port, an output port, a receiver, a transmitter, one or more storage devices (e.g., a tape drive, a floppy drive, a hard disk drive, a compact disk drive, and the like), or the like, as well as various combinations thereof).

It will be appreciated that computer 1200 depicted in FIG. 12 provides a general architecture and functionality suitable for implementing functional elements described herein and/or portions of functional elements described herein. For example, computer 1200 provides a general architecture and functionality suitable for implementing one or more of transmitting unit 110, receiving unit 120, or any other units, elements, components, or the like.

It will be appreciated that the functions depicted and described herein may be implemented in software (e.g., via implementation of software on one or more processors, for executing on a general purpose computer (e.g., via execution by one or more processors) so as to implement a special purpose computer, and the like) and/or may be implemented in hardware (e.g., using a general purpose computer, one or more application specific integrated circuits (ASIC), and/or any other hardware equivalents).

It will be appreciated that some of the steps discussed herein as software methods may be implemented within hardware, for example, as circuitry that cooperates with the processor to perform various method steps. Portions of the functions/elements described herein may be implemented as a computer program product wherein computer instructions, when processed by a computer, adapt the operation of the computer such that the methods and/or techniques described herein are invoked or otherwise provided. Instructions for invoking methods described herein may be stored in fixed or removable media (e.g., non-transitory computer-readable storage media), transmitted via a data stream in a broadcast or other signal bearing medium, and/or stored within a memory within a computing device operating according to the instructions.

It will be appreciated that the term "or" as used herein refers to a non-exclusive "or," unless otherwise indicated (e.g., use of "or else" or "or in the alternative").

It will be appreciated that, although various embodiments which incorporate the teachings presented herein have been shown and described in detail herein, those skilled in the art can readily devise many other varied embodiments that still incorporate these teachings.

What is claimed is:

1. An apparatus configured to evaluate a set of values organized based on a set of bit positions, each of the values including a respective set of bits associated with the respective bit positions, the apparatus comprising:
a set of hardware modules associated with the respective bit positions, the set of hardware modules configured to determine, based on a set of bitwise comparisons performed for the respective bit positions based on the bits of the values associated with the respective bit positions, a magnitude of a minimum value of the set of values;
wherein, for each of the hardware modules associated with the respective bit positions, the respective hardware module includes a respective bit detector module configured to receive a respective set of input bits for the respective bit position and configured to generate a respective output bit indicative as to whether at least one of the input bits for the respective bit position is a first bit value;
wherein, for each of a subset of the hardware modules associated with the respective bit positions, the respective hardware module includes a respective mask generation module configured to generate, based on the respective set of bits associated with the respective bit position and based on the respective output bit generated by the respective bit detector module for the respective bit position, a respective disable signal comprising a respective set of disable bits associated with the respective values of the set of values, wherein, based on the respective output bit generated by the respective bit detector module for the respective bit position being indicative that at least one of the input bits for the respective bit position is the first bit value, each of the disable bits associated with a respective one of the values for which the bit in the respective bit position of the value is a second bit value and the bit in a next bit position of the value is the first bit value is configured to change the bit in the next bit position of the value from the first bit value to the second bit value for processing by the bit detector module associated with the next bit position.

2. The apparatus of claim 1, wherein, for a most significant bit (MSB) position of the set of bit positions, the respective set of input bits comprises the MSBs of the values of the set of values.

3. The apparatus of claim 1, wherein, for a given one of the bit positions of the set of bit positions other than the most significant bit (MSB) position of the set of bit positions, the respective set of input bits received by the respective bit detector module comprises a set of masked bits formed based on the respective set of bits of the given one of the bit positions and the respective disable signal associated with a next-least-significant bit position of the set of bit positions.

4. The apparatus of claim 1, wherein, to generate the respective output bit indicative as to whether at least one of the input bits for the respective bit position is the first bit value, the respective bit detector module is configured to:
set the respective output bit to the first bit value based on a determination that at least one of the input bits for the respective bit position is the first bit value or set the respective output bit to a second bit value based on a determination that none of the input bits for the respective bit position are the first bit value.

5. The apparatus of claim 1, wherein, to generate the respective output bit indicative as to whether at least one of the input bits for the respective bit position is the first bit value, the respective bit detector module is configured to:
perform a logical AND operation on the respective input bits at the respective bit position to provide thereby the respective output bit for the respective bit position.

6. The apparatus of claim 1, wherein, to generate the respective output bit indicative as to whether at least one of the input bits for the respective bit position is the first bit value, the respective bit detector module is configured to:

a logical NAND operation on the respective input bits at the respective bit position to provide an intermediate bit; and invert the intermediate bit to provide thereby the respective output bit for the respective bit position.

7. The apparatus of claim 1, wherein the output bits are collectively indicative of the magnitude of the minimum value of the set of values.

8. The apparatus of claim 1, wherein the set of hardware modules is configured to:

output the output bits, wherein the output bits are collectively indicative of the magnitude of the minimum value of the set of values.

9. The apparatus of claim 1, wherein the set of hardware modules is configured to determine, based on the set of bitwise comparisons performed for the respective bit positions, an identification of one of the values of the set of values having the magnitude of the minimum value of the set of values.

10. The apparatus of claim 9, wherein one of the hardware modules associated with a least significant bit (LSB) position of the set of bit positions is configured to:

output an indicator value providing the identification of the one of the values of the set of values having the magnitude of the minimum value of the set of values.

11. The apparatus of claim 10, wherein, to output the indicator value, the one of the hardware modules associated with the LSB position is configured to:

generate a set of masked bits associated with the LSB position of the set of bit positions based on the respective set of LSBs of the values and the respective disable signal associated with a next-least-significant bit position of the set of bit positions; and determine, based on the set of masked bits associated with the LSB position of the set of bit positions, the one of the values of the set of values having the magnitude of the minimum value of the set of values.

12. The apparatus of claim 11, wherein, to determine, based on the set of masked bits associated with the LSB position of the set of bit positions, the one of the values of the set of values having the magnitude of the minimum value of the set of values, the hardware module associated with the LSB position is configured to:

perform a lookup, using the set of masked bits as a key, to determine the indicator value providing the identification of the one of the values of the set of values having the magnitude of the minimum value of the set of values.

13. The apparatus of claim 1, wherein the subset of the hardware modules comprises the hardware modules associated with each of the bit positions except for a least significant bit (LSB) position of the set of bit positions.

14. The apparatus of claim 1, wherein, for each of a second subset of the hardware modules associated with the respective bit positions, the respective hardware module includes a respective mask application module configured to apply the respective disable signal associated with a next-least-significant bit position of the set of bit positions to the respective set of bits of the respective bit position to provide thereby a set of masked bits for use as the respective set of input bits for the respective bit detector module of the respective bit position.

15. The apparatus of claim 14, wherein, for at least one of the mask application modules of the second subset of hardware modules, the mask application module comprises:

a respective set of NOR gates configured to receive the respective disable bits of the respective disable signal associated with the next-least-significant bit position of the set of bit positions, receive the respective set of bits of the respective bit position, and output the set of masked bits for use as the respective set of input bits for the respective bit detector module of the respective bit position.

16. The apparatus of claim 14, wherein the second subset of the hardware modules comprises the hardware modules associated with each of the bit positions except for a most significant bit (MSB) position of the set of bit positions.

17. An apparatus configured to evaluate a set of values organized based on a set of bit positions, each of the values including a respective set of bits associated with the respective bit positions, the apparatus comprising:

a set of hardware modules comprising:

a first bit detector module associated with a first bit position of the set of bit positions, the first bit detector module configured to receive a respective set of input bits associated with the respective values and generate, for the first bit position, a respective output bit indicative as to whether at least one of the input bits is a first bit value; and a mask generation module configured to generate a disable signal based on the set of bits associated with the first bit position and based on the respective output bit generated for the first bit position, the disable signal comprising a set of disable bits associated with the respective values of the set of values, wherein, based on the respective output bit generated for the first bit position being indicative that at least one of the input bits of the first bit position is the first bit value, each of the disable bits associated with a respective one of the values for which the bit in the first bit position of the value is a second bit value and the bit in a second bit position of the value is the first bit value is configured to change the bit in the second bit position of the value from the first bit value to the second bit value for processing by a second bit detector module associated with the second bit position.

18. An apparatus, comprising:

a hardware module configured to:

receive a set of values organized based on a set of bit positions, each of the values including a respective set of bits associated with the respective bit positions; and determine at least one characteristic of a minimum value of the set of values, wherein the at least one characteristic of the minimum value of the set of values is determined based on a set of bitwise comparisons performed for the respective bit positions based on the bits of the values associated with the respective bit positions, wherein the at least one characteristic of the minimum value of the set of values is determined based on generation of disable signals configured to prevent select bits of the bit positions from being evaluated during select ones of the bitwise comparisons based on determinations that the select bits are associated with respective ones of the values already disqualified from being the minimum value of the set of values.

19. The apparatus of claim 18, wherein the at least one characteristic of the minimum value of the set of values comprises at least one of a magnitude of the minimum value of the set of values or an identification of one of the values of the set of values corresponding to the minimum value of the set of values.

20. The apparatus of claim 19, wherein the at least one characteristic of the minimum value of the set of values comprises the magnitude of the minimum value of the set of values and the identification of one of the values of the set of values corresponding to the minimum value of the set of values.

\* \* \* \* \*